(12) United States Patent
Paul et al.

(10) Patent No.: US 7,911,277 B2
(45) Date of Patent: Mar. 22, 2011

(54) ADAPTIVELY TUNED RF POWER AMPLIFIER

(75) Inventors: Susanne A. Paul, Austin, TX (US);
Marius Goldenberg, Austin, TX (US);
Aria Eshraghi, Austin, TX (US)

(73) Assignee: Black Sand Technologies, Inc., Austin, TX (US)

( * ) Notice: Subject to any disclaimer, the term of this patent is extended or adjusted under 35 U.S.C. 154(b) by 34 days.

(21) Appl. No.: 12/252,993

(22) Filed: Oct. 16, 2008

(65) Prior Publication Data
US 2009/0096533 A1 Apr. 16, 2009

Related U.S. Application Data

(60) Provisional application No. 60/980,319, filed on Oct. 16, 2007.

(51) Int. Cl.
*H03F 3/191* (2006.01)
(52) U.S. Cl. ........................... 330/305; 330/284
(58) Field of Classification Search .................. 330/136, 330/192, 284, 302, 305
See application file for complete search history.

(56) References Cited

U.S. PATENT DOCUMENTS

| 4,859,967 | A | | 8/1989 | Swanson |
| 5,063,332 | A | * | 11/1991 | El-Hamamsy et al. ......... 315/48 |
| 5,432,473 | A | | 7/1995 | Mattila et al. |
| 5,442,322 | A | | 8/1995 | Kornfeld et al. |
| 5,564,086 | A | | 10/1996 | Cygan et al. |
| 5,724,003 | A | | 3/1998 | Jensen et al. |
| 6,064,266 | A | | 5/2000 | Anderson et al. |
| 6,362,606 | B1 | | 3/2002 | Dupuis et al. |
| 6,392,488 | B1 | | 5/2002 | Dupuis et al. |
| 6,448,847 | B1 | | 9/2002 | Paul et al. |
| 6,462,620 | B1 | | 10/2002 | Dupuis et al. |
| 6,549,071 | B1 | | 4/2003 | Paul et al. |
| 6,727,754 | B2 | | 4/2004 | Dupuis et al. |
| 6,737,698 | B1 | | 5/2004 | Paul et al. |
| 6,756,849 | B2 | | 6/2004 | Dupuis et al. |
| 6,788,141 | B2 | | 9/2004 | Paul et al. |
| 6,816,011 | B2 | | 11/2004 | Paul et al. |
| 6,917,245 | B2 | | 7/2005 | Dupuis et al. |
| 6,927,630 | B2 | | 8/2005 | Dupuis et al. |

(Continued)

FOREIGN PATENT DOCUMENTS

JP 2006060729 A 3/2006

OTHER PUBLICATIONS

International Search Report and Written Opinion mailed Jun. 18, 2009 for PCT/US2008/080158, 12 pages.

(Continued)

*Primary Examiner* — Khanh V Nguyen
(74) *Attorney, Agent, or Firm* — Zagorin O'Brien Graham LLP

(57) ABSTRACT

An adaptively tuned RF power amplifier includes at least one power amplifier stage that has one or more active elements. A tunable output network is coupled to the power amplifier stage and includes one or more adjustable reactive elements. A mismatch detector detects a tuning mismatch based, at least in part, on one or more signals present within the tunable output network, and supplies one or more mismatch signals indicative of a detected tuning mismatch. A tuning controller, responsive to the one or more mismatch signals, controls one or more of the one or more adjustable reactive elements in the tunable output network so as to control the detected mismatch.

25 Claims, 20 Drawing Sheets

U.S. PATENT DOCUMENTS

| | | | |
|---|---|---|---|
| 6,969,680 B2 | 11/2005 | Paul et al. | |
| 6,980,780 B2 | 12/2005 | Chen et al. | |
| 7,053,718 B2 | 5/2006 | Dupuis et al. | |
| 7,064,605 B2 | 6/2006 | Westwick et al. | |
| 7,113,045 B2 | 9/2006 | Westwick et al. | |
| 7,123,096 B2 | 10/2006 | Selin | |
| 7,161,423 B2 | 1/2007 | Paul et al. | |
| 7,161,427 B2 | 1/2007 | Westwick et al. | |
| 7,164,315 B2 | 1/2007 | Camnitz et al. | |
| 7,202,734 B1 * | 4/2007 | Raab | 330/305 |
| 7,212,070 B2 | 5/2007 | Westwick et al. | |
| 7,215,206 B2 | 5/2007 | Dupuis et al. | |
| 7,224,232 B2 | 5/2007 | Paul et al. | |
| 7,233,199 B2 | 6/2007 | Westwick et al. | |
| 7,372,327 B2 | 5/2008 | Westwick et al. | |
| 7,446,613 B2 | 11/2008 | Westwick et al. | |
| 7,511,578 B2 | 3/2009 | Dupuis et al. | |
| 7,629,843 B2 | 12/2009 | Paul et al. | |
| 7,675,364 B2 | 3/2010 | Westwick et al. | |
| 7,710,199 B2 | 5/2010 | Bocock et al. | |
| 7,714,371 B2 | 5/2010 | Paul et al. | |
| 7,754,606 B2 | 7/2010 | Paul et al. | |
| 7,760,023 B2 | 7/2010 | Bockelman et al. | |
| 2003/0030504 A1 | 2/2003 | Dixit et al. | |
| 2004/0012442 A1 | 1/2004 | Ichitsubo et al. | |
| 2004/0075504 A1 | 4/2004 | Vintola | |
| 2004/0100330 A1 | 5/2004 | Chandler et al. | |
| 2005/0052167 A1 | 3/2005 | Paul et al. | |
| 2005/0052235 A1 | 3/2005 | Paul et al. | |
| 2005/0052236 A1 | 3/2005 | Paul et al. | |
| 2005/0052237 A1 | 3/2005 | Paul et al. | |
| 2005/0059362 A1 | 3/2005 | Kalajo et al. | |
| 2005/0195037 A1 | 9/2005 | Dupuis et al. | |
| 2005/0270105 A1 | 12/2005 | Van Bezooijen et al. | |
| 2006/0025088 A1 | 2/2006 | Pietig et al. | |
| 2006/0160501 A1 | 7/2006 | Mendolia et al. | |
| 2006/0208799 A1 | 9/2006 | Paul et al. | |
| 2007/0057728 A1 | 3/2007 | Autti | |
| 2007/0096816 A1 | 5/2007 | Paul et al. | |
| 2008/0284512 A1 | 11/2008 | Paul et al. | |
| 2010/0201346 A1 | 8/2010 | You | |

OTHER PUBLICATIONS

Firrao, E. L. et al., "An Automatic Antenna Tuning System Using Only RF Signal Amplitudes," IEEE Transactions on Circuits and Systems—II: Express Briefs, vol. 55, No. 9, Sep. 2008, pp. 833-837.

* cited by examiner

```
/* Infinite Real and Imaginary loops*/
main() {
   n = 0;
   /* Beginning of the Imaginary adjustment loop */
   do {
      /* Initialize counter n */
      n = 0;

/* Compute the sum and the difference of caps */
      S = (C5 + C6) + C3;
      D = (C5 + C6) - C3;

Read(I);
      if I > 0 {
         C3 = C3 + a;
         C6 = C6 + a;
         /* Update D_min */
         D_min = (S + D_min)*sqrt((S+2*a)/S) - (S+2*a);

}
      else {
         C3 = C3 - a;
         C6 = C6 - a;
         /* Update D_min */
         D_min = (S + D_min)*sqrt((S-2*a)/S) - (S-2*a);

}

/* Beginning of the Real adjustment loop */
      do {
         Read(R);
         if R > 0 {
            if ((D - 2*b) >= D_min) {
               C3 = C3 + b;
               C6 = C6 - b;
            }
         }
         else {
            C3 = C3 - b;
            C6 = C6 + b;
         }
         n = n + 1;
      } while (n < k)
   } while (1)
}

/* Interrupt Service Routine */
ISR() {
   C3 = C3 - b;
   C6 = C6 + b;
   D_min = (C5 + C6) - C3;
}
```

FIG. 25

ADAPTIVELY TUNED RF POWER AMPLIFIER

CROSS-REFERENCE TO RELATED APPLICATION(S)

This application claims benefit under 35 U.S.C. §119(e) of provisional application 60/980,319, filed Oct. 16, 2007, entitled "Adaptively Tuned Power Amplifier," naming Susanne A. Paul, Marius Goldenberg, and Aria Eshraghi as inventors, which application is incorporated herein by reference in its entirety.

BACKGROUND

1. Field of the Invention

This following invention relates to RF power amplifiers such as those used for wireless applications.

2. Description of the Related Art

Radio frequency (RF) power amplifiers (PAs) are commonly used within the transmit path for wireless applications to boost the transmitted power provided to the antenna. They are typically designed to provide power into a fixed impedance load, such as 50 ohm, and are designed to operate from a fixed supply voltage, such as 3.5V. At its output, the power amplifier (PA) has an output network that is formed from passive components, such as inductors, capacitors, and transformers that are arranged in a tuned configuration. The networks formed from these passive elements are resonant at frequencies near that of the desired radio frequency (RF) carrier. Within this narrow frequency range, the circuit provides impedance transformation. Without impedance transformation, the maximum power that could be delivered by the power amplifier to a fixed load would be limited by the amplifier's supply voltage. With impedance transformation, the power amplifier can provide an output power that is higher than this limit.

Three important performance metrics for RF power amplifiers are output power, efficiency, and linearity. It is important that the PA meets a desired transmit power level. This assures a good connection between the transmitter and receiver and for many systems is required for type approval testing. It is also important that the PA transmits with high efficiency. This minimizes battery drain and heat generation. Finally, it is important that the PA transmits with good linearity to assure that it does not generate power at frequencies other than those that are desired.

FIG. 1 shows an example of an RF power amplifier and associated output network that are well known in the field. The amplifier's final stage is formed from transistor 102 and inductor 103. Capacitor 109 acts as a DC blocking element and elements 105, 106, and 107 perform impedance transformation, transforming the load impedance 111 from its actual value, $R_L$, to new impedance, $Z_T$, seen by the final PA stage. The ratio $R_L/Z_T$ is referred to as the transformation ratio. The load impedance $R_L$ is usually purely real. Components in the amplifier's output network are usually chosen so that $Z_T$ is strictly real as well.

FIG. 2 shows an example of a common transmit chain for wireless transmitters. The PA's amplification stages, 202, are followed by an output network, 204, which is followed by an isolator, 206, and then a directional coupler, 208. An isolator is a passive device that provides the PA with a more controlled load impedance despite large variations in antenna impedance. The directional coupler generates an output signal, 210, that represents the level of power being transmitted to the antenna. This measure is fed back to the amplifier stages where it is used to control power levels being generated. In some cases, the purpose of this loop is to reduce variations in transmitted power from device to device and over conditions such as temperature. In other cases, this loop is used to assure that the maximum power provided to the antenna remains below a maximum limit as set by safety considerations.

Thus, power amplifiers are an important component of wireless technology and improvements in operation of the power amplifier are desirable.

SUMMARY

Accordingly, embodiments of the present invention provide a power amplifier with reduced sensitivity to component variations and design inaccuracies. Further, an embodiment of the present invention provides a power amplifier with well controlled output power, efficiency, and linearity over a wide range of loads and/or over a wide range of operating frequencies. In an embodiment, the present invention provides a power amplifier that reduces both real and imaginary output network mismatches caused by either component variations or load variations or operation in different frequency bands since both real and imaginary output network mismatches are undesirable in RF power amplifiers. An embodiment of the present invention provides a power amplifier with well controlled gain over a wide range of power levels and over a wide range of conditions such as temperature and supply voltage. An embodiment of the invention provides a power amplifier that automatically limits or controls voltage swings across or current swings within elements of the tunable output network. An embodiment of the invention provides a power amplifier that has reduced amplitude distortion despite imperfections in its active gain stages.

An exemplary embodiment of the present invention is an RF power amplifier that includes a tunable output network, senses real and/or imaginary mismatches at its output, and adaptively adjusts its tunable output network to reduce or eliminate these mismatches. In an embodiment of the present invention the output network's characteristics are maintained substantially at those for which the amplifier's output stage is optimized to deliver a desired power with the desired combination of efficiency, linearity, voltage swings, and other metrics of importance.

BRIEF DESCRIPTION OF THE DRAWINGS

The present invention may be better understood, and its numerous objects, features, and advantages made apparent to those skilled in the art by referencing the accompanying drawings.

FIG. 25 illustrates an exemplary tuning algorithm for use with the embodiment shown in FIG. 24.

The use of the same reference symbols in different drawings indicates similar or identical items.

DESCRIPTION OF THE PREFERRED EMBODIMENT(S)

Figure 3:
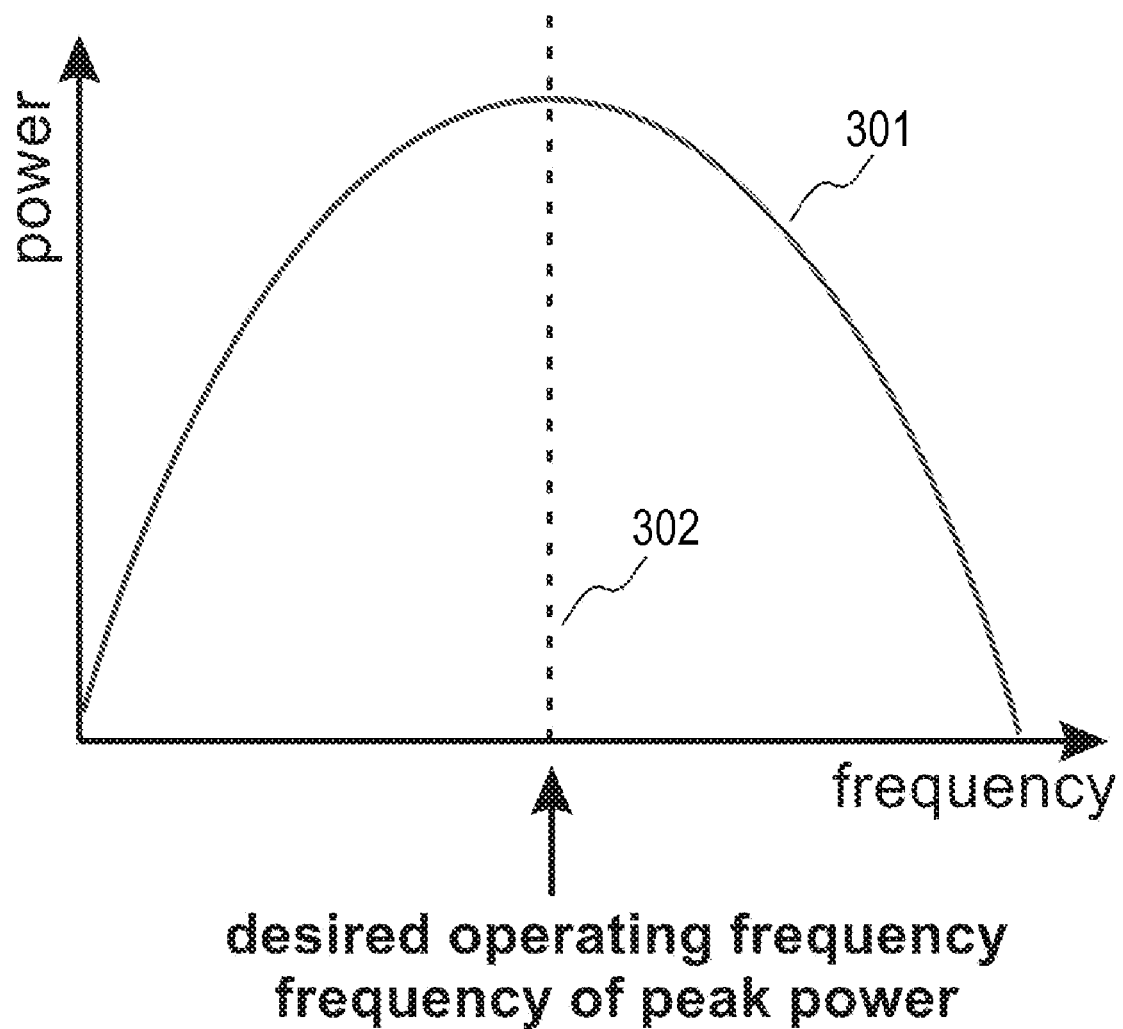
FIG. 3 shows output power or frequency response of a power amplifier.

One problem facing RF power amplifiers is that their output network is made from tuned elements and is narrow band. An example of the output power or frequency response of such an amplifier is shown in FIG. 3. The amplifier's output power, denoted by curve 301, is a function of frequency. A typical response peaks at one frequency, 302, and drops off rapidly as frequency varies from this point. Away from the frequency of peak power the output power of the amplifier is less than desired, its efficiency is reduced, and its linearity is likely reduced too.

In most cases, RF amplifiers are designed for use in narrow band systems, where the bandwidth of signals being transmitted falls near point 302 and lies within the relatively flat center portion of the response curve in FIG. 3. However, even for narrow band signals, the narrow-band response of the PA's output network creates problems. First, components will inevitably deviate from their desired values. Second, the PA's load will inevitably deviate from the value that the amplifier was designed to drive. Third, it may be desirable to operate a single PA over multiple widely spaced frequency bands.

Figure 4:
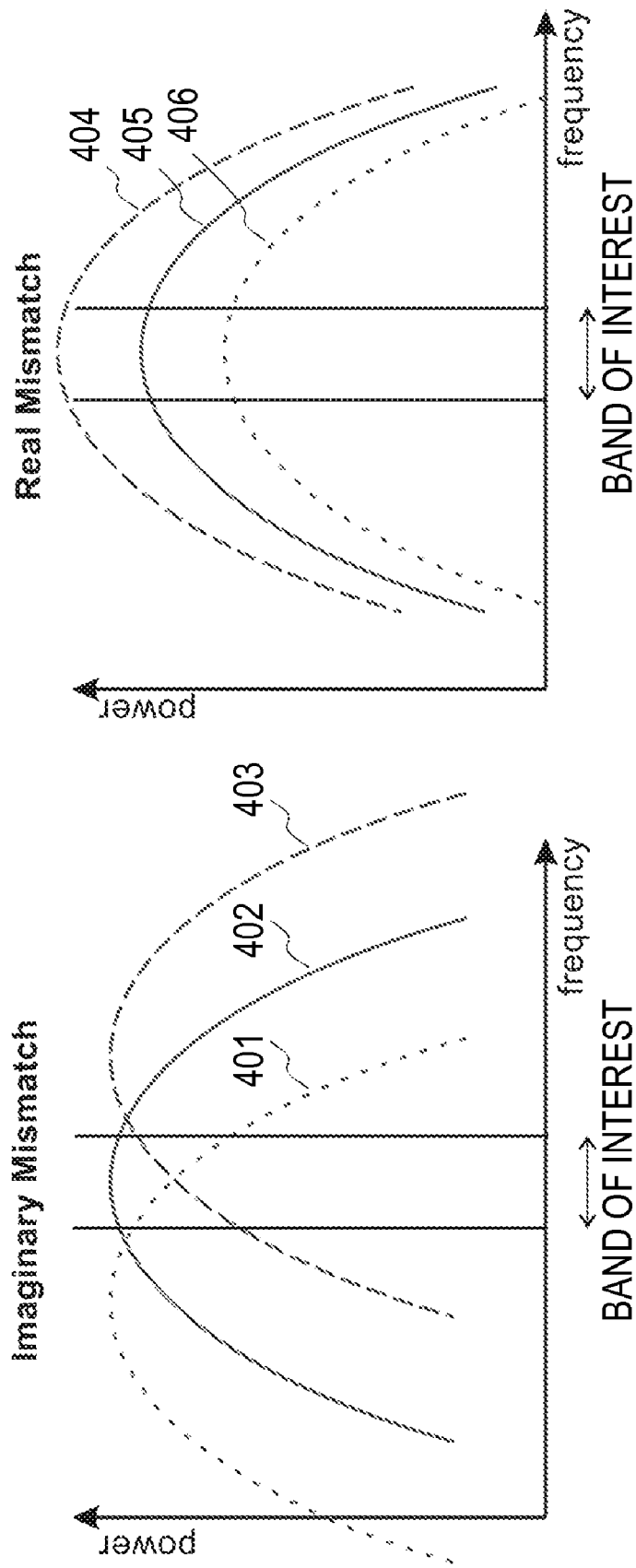
FIG. 4 illustrates an amplifier's actual output response as compared to a desired response.

Component values within the PA's output network will vary from their desired target as a result of design imperfections and will vary from part to part as a result of manufacturing imperfections. This causes the amplifier's actual output response to follow curves 401, 403, 404, or 406 in FIG. 4 rather than the desired curves, 402 and 405. When this happens, the output network is said to have a tuning mismatch or to be mismatched or to be mistuned. In this usage, the terms mismatched or mistuned mean that the output network's response differs from its desired or targeted value. The targeted value is usually, although not always, equal to the transformed impedance for which the PA delivers the desired power to its load with an optimal efficiency. The term mismatched is not limited to a condition where the desired or targeted impedance is a complex conjugate match to a second impedance.

Two possible parts to tuning mismatch are an imaginary part and a real part. An imaginary mismatch means that the imaginary part of the transformed impedance $Z_T$ is not equal to its desired value and a real mismatch means that the real part of $Z_T$ is not equal to its desired value. In most cases the desired imaginary part of $Z_T$ is zero and an imaginary mismatch means that the load has a reactive component. With regard to FIG. 4, an imaginary mismatch results if the power-vs.-frequency curve moves to higher or lower frequencies, such as with curves 401 and 403. A real mismatch results if the power-vs.-frequency curve moves to higher or lower power levels, such as with curves 404 and 406.

A real or imaginary mismatch can also occur when the PA's load impedance differs from its anticipated value. Many factors can cause this to occur. For example, in a wireless transmitter with an antenna, the antenna impedance is a strong function of its surrounding environment. As the antenna impedance changes, the load seen by the PA changes as well. This is true even when the antenna is not directly connected to the PA in the transmit chain. As a result, a PA designed to operate properly under one specific antenna environment will operate differently under every other antenna environment. As a second example, the PA in a wireless transmitter may be followed by a duplexer or a switch. These components are themselves subject to component variations which will cause their actual input impedance to vary from part to part and to differ from its nominal value. As a result, a PA that is optimized for one particular load will experience an output network mismatch and will perform worse when its load changes.

A real or imaginary mismatch can also occur when the PA is operating at a frequency that differs from that at which its output network is tuned. Many systems, such as cellular phones, are required to operate over multiple frequency bands. As a result of their narrow band characteristics, currently available PAs do not operate with good performance across different frequency bands that are spaced more than a few percent apart. The wider the spacing between bands is, the greater the mismatch that is present in all but the nominal band.

A real or imaginary mismatch can also occur when the PA's supply voltage is reduced from its nominal value. This can occur when, for example, the battery in a portable device is nearly drained. This can also occur when devices such as laptop cards are powered from a fixed supply whose voltage is less than the supply that the power amplifier requires to produce full power.

Problems Caused by an Imaginary Mismatch

When an imaginary mismatch is present at an amplifier's output, the band of interest does not correspond to the maximum of the power transfer curve and instead lies on the side of the curve where the slope is large and power drops off rapidly. Power generated by the amplifier's final stage is attenuated and is not received by the load. In an application such as a cellular phone this could result in a dropped call because the receiver receives too weak of a signal to support the connection. In an application such as a data card this could result in a reduction in the available data rate because the data rate is a function of the power level received at the receiver.

An imaginary mismatch also causes reduced amplifier efficiency. Any reactive portion of the transformed impedance, $Z_T$, results in reactive currents in the output network. These currents flow through transistors in the amplifier's output stage and through passive elements in the output network, in both cases producing loss. Efficiency is also reduced because the load power is reduced. The resulting reduction in efficiency is a problem for mobile devices because it causes greater battery drain. It is also a problem for size-sensitive devices because it generates additional heat.

An imaginary mismatch also causes reduced amplifier linearity. The output network's imaginary currents cause peak voltages and currents to increase in the final amplifier stage. The result is amplitude and phase distortion and, in the presence of a modulated signal, a spreading of the signal spectrum. This is a problem for many wireless communication devices because undesired frequency components interfere with other devices operating in the same frequency range.

Problems Caused by a Real Mismatch

A real mismatch causes the actual transformed impedance to differ from its targeted value and causes the PA to produce an output power that differs from its desired level. This is a problem for wireless transmitters because they are required to produce a precise power level. The presence of such mismatches also causes problems in manufacturing because transmitters may require individual calibration on the factory floor to set output power at its correct level.

A real mismatch also causes reduced efficiency when too much power is delivered to the load. In this case, the transmitter must back off to reduce its power either by a reduction in the PA's input amplitude, a reduction in its gain, or a reduction in its supply voltage. This occurs either during transmitter calibration or as part of a broader power control loop and causes the PA to operate less efficiently. PAs operate most efficiently near their maximum power and efficiency drops rapidly as the amplifier is backed off.

A real mismatch also results in reduced efficiency when too little power is delivered to the load. In this case the amplifier must increase its generated power to compensate, provided it is able to do so. Extra dynamic range must be allocated within the transmitter to allow for such an increase. This means that the amplifier is nominally operating with a larger backoff, which translates into reduced nominal efficiency.

In a linear PA, a real mismatch can also result in reduced linearity. For the amplifier's active stages to remain linear, they must remain out of saturation. When the transformed load impedance is higher than expected, the output stage's voltage swing increases and the amplifier is driven closer to voltage saturation. When the transformed load impedance is lower than expected, the output stage's current swing increases and the amplifier is driven closer to current saturation, which is set by its available bias current.

Isolators

Mismatches at the PA's output can cause a reduction in PA efficiency and linearity and cause the PA's output power to deviate from its desired value. These mismatches can occur as a result of component variations, load variations, or frequency variations. In order to mitigate these effects, some transmitters use the configuration shown in FIG. 2, which includes an isolator. The isolator, 206, provides the output network, 204, with a more controlled, nearly constant load impedance despite variations in antenna impedance. As a result, voltage and current swings in the PA's final stage remain constant over load changes and linearity is improved. Power delivered to the isolator remains constant over load and even though the power that would otherwise be reflected is dissipated within the isolator itself, this translates into reduced power variation at the antenna.

However, an isolator can only correct for mismatches that occur after its output. Other components, before this point, can also cause power levels at the transmitter output to vary. An isolator cannot correct for mismatches within the PA's output network and cannot correct for mismatches that occur as a result of variation in operating frequency. An isolator also cannot correct for its own internal component variations that cause its response to vary from part to part.

An isolator also has disadvantages. First, it increases transmitter cost and board area. Second, isolators introduce loss that reduces the effective PA efficiency. Third, isolators improve power transfer from the PA to the isolator but most of the additional power transferred is dissipated in the isolator rather than passed on to elements later in the transmit chain. Finally, an isolator is a tuned element and only provides isolation over a narrow range of frequencies. This tuning must be closely aligned with that of the PA and its variation presents an additional source of part-to-part variability.

Directional Couplers

An isolator cannot correct for changes in the PA's gain. The gain of a PA varies systematically as a function of process and device variations. PA gain also varies over time due to changes in conditions such as temperature, power supply, and RF frequency. In many systems, absolute power accuracy must be maintained over a wide range of power levels from minimum to maximum power. An isolator does not provide any improvement in this regard.

Figure 1:
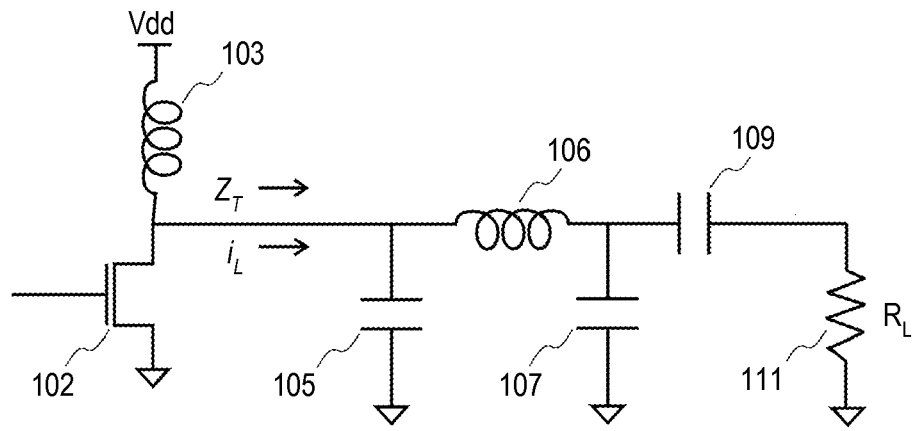
FIG. 1 shows an example of an RF power amplifier and associated output network that are well known in the field.
Figure 2:
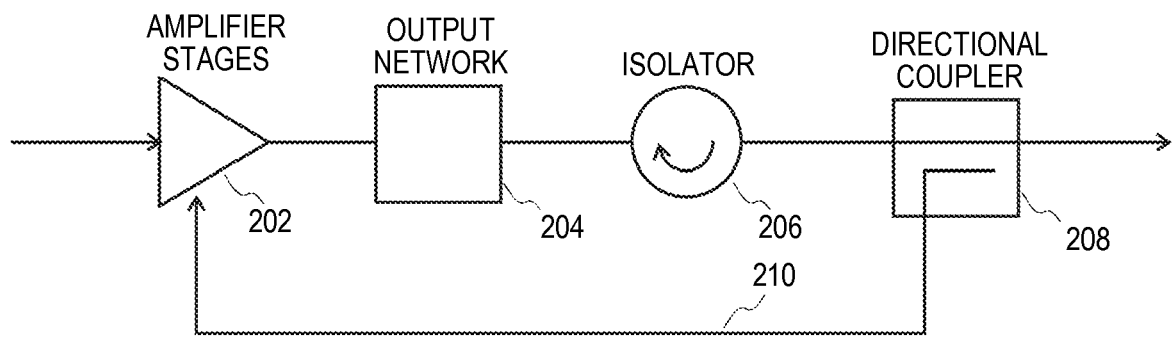
FIG. 2 shows an example of a common transmit chain for wireless transmitters.

When better control is needed over absolute power levels than can be achieved from an isolator alone, a directional coupler 208, such as that shown in FIG. 2, can be used between the PA and the antenna. A directional coupler senses the power being delivered to the load and produces an output at a third terminal that represents this quantity. This signal 210 can then be used as part of a broader power control loop to set power at the PA's output to a desired level. Adjustment of the PA's gain typically occurs by changing its input amplitude, its bias current, or its supply voltage.

When power levels at the PA output are reduced due to an output network mismatch, a load mismatch, a frequency mismatch, or a power supply reduction, a power control loop will attempt to increase the PA's gain to compensate. However, such mismatches can easily cause a power reduction of many dB. A PA that is able to compensate by increasing its gain must operate with many dB of additional backoff under nominal conditions. This brings a substantial decrease in amplifier efficiency that is unacceptable for most applications. As a result, power control loops usually only compensate for small variations in power, such as those due to temperature or process, and do not have the range to compensate for a power reduction caused by output network mismatches, load mismatches, frequency mismatches, or power supply reductions.

Directional couplers also have a few disadvantages. They add cost and area to the transmit path. They introduce additional loss that reduces the effective PA efficiency. A directional coupler is a tuned element and only provides good directionality over a narrow frequency range, which must be aligned with that of the PA. Finally, directional couplers are themselves sources of part-to-part variability.

Figure 5:
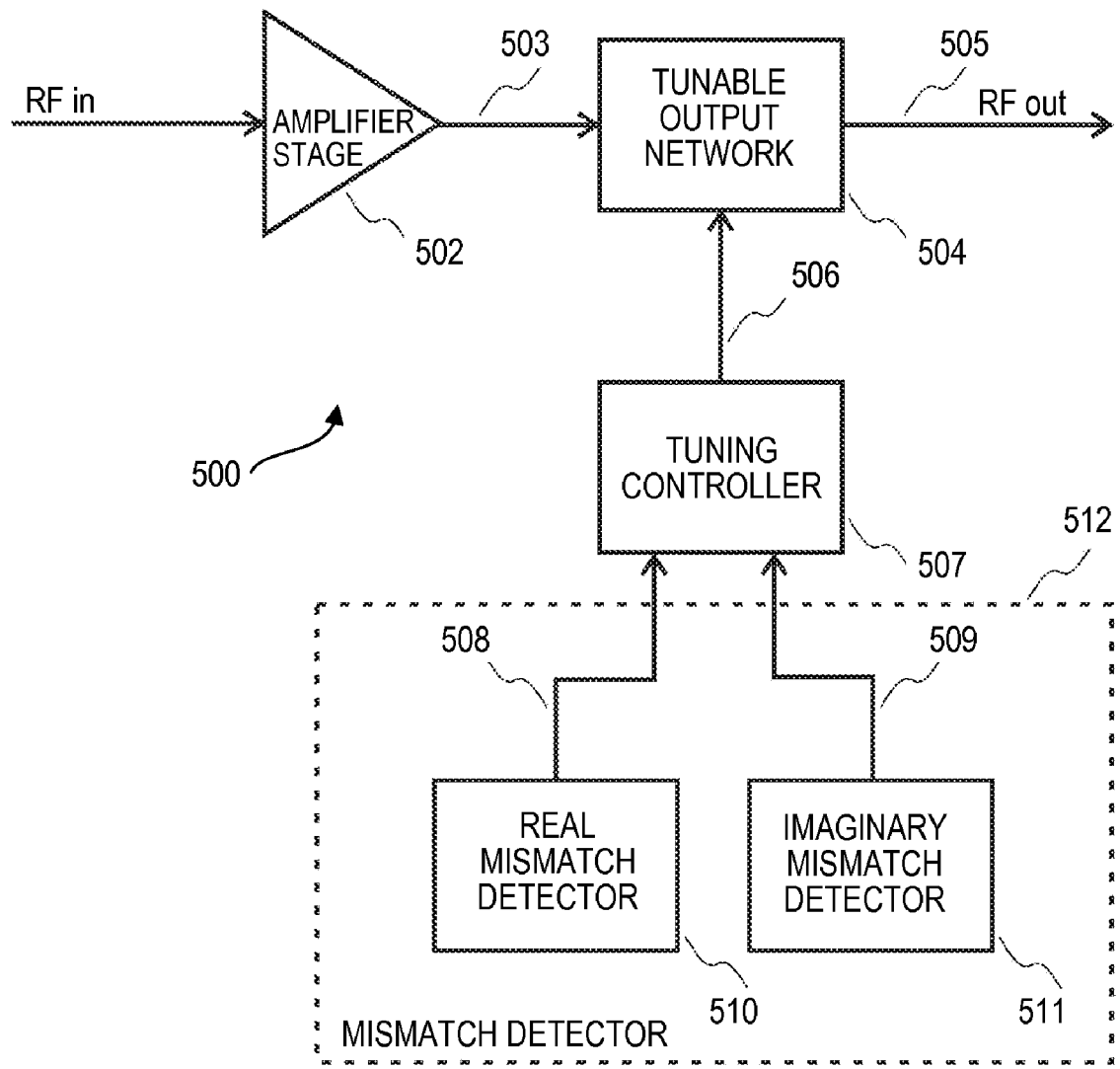
FIG. 5 illustrates an exemplary power amplifier according to an embodiment of the present invention.

Rather than use isolators or directional couplers to deal with output network mismatch, it is advantageous to have the PA deal with mismatches itself. A block diagram of one such embodiment in which the PA corrects mismatches by detecting and correcting the mismatch within the PA itself is shown in FIG. 5. That overcomes many of the disadvantages identified with directional couplers or isolators identified above. The power amplifier 500 includes one or more amplifier stages including final amplifier stage, 502, that generates one or more signals, 503, that are inputs to a tunable output network, 504. The tunable output network generates one or more signals, 505, at the PA's output. The tunable output network includes one or more passive components at least one of which can be varied in order to produce a change in its transfer characteristic. The tunable output network transforms the load present at the PA's output, 505, to a desired impedance seen at node 503 by elements in the final amplifier stage.

The purpose of mismatch detector, 512, is to sense mismatches. Since a mismatch can be any undesired property of circuits after the amplifier's final stage, there are many different ways to sense mismatches. When the goal of the power amplifier's adaptive tuning is to control output impedance levels, mismatches can be categorized as real or imaginary or a combination of both. In this case, mismatches can be sensed with a combination of real mismatch detectors and/or imaginary mismatch detectors. In other cases, such as when the output network includes active elements, mismatches are not readily represented by a combination of real and imaginary parts.

The embodiment shown in FIG. 5 includes real and imaginary mismatch detectors. Real mismatch detector, 510, senses the real-part mismatch at the PA's output and generates signal 508, representing this quantity. Imaginary mismatch detector, 511, senses the imaginary-part mismatch at the PA's output and generates signal 509, representing this quantity. Outputs from the real and imaginary mismatch detectors are provided to a tuning controller, 507, which combines information regarding the real mismatch and the imaginary mismatch and decides how to best restore both real and imaginary impedances to their desired values. The tuning controller's output, 506, includes one or more control signals that are used within the tunable output network to alter the values of variable elements such as varactors to achieve the desired impedance change.

Various embodiments of each of the blocks in FIG. 5 are described in the sections below.

Amplifier Stage

Figure 6:
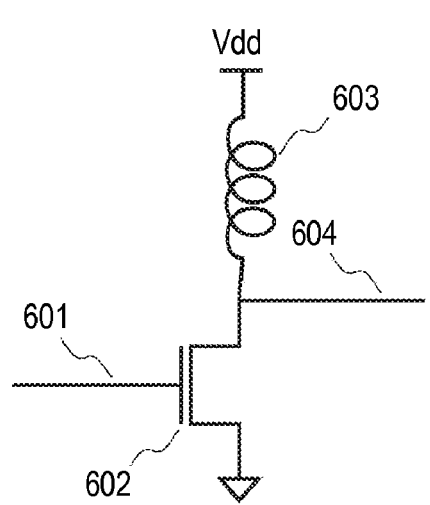
FIG. 6 illustrates a first embodiment of a suitable amplifier stage.

The amplifier stage, 502, in FIG. 5 can be implemented using any suitable RF power amplifier techniques. A first embodiment of a suitable amplifier is the topology shown in FIG. 6. The amplifier stage includes transistor 602 receiving input 601 and inductor 603. The amplifier output node, 604, is provided as input to the tunable output network.

Figure 7:
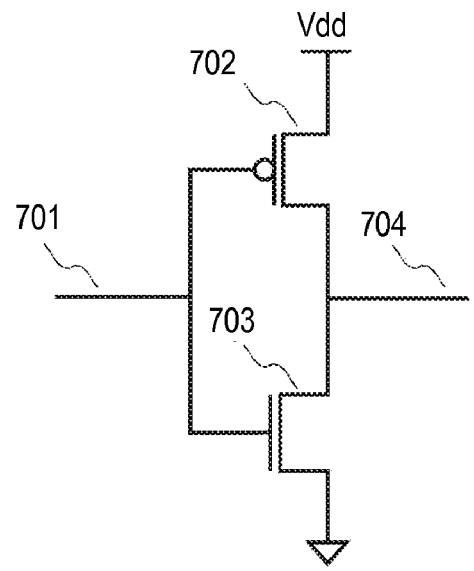
FIG. 7 illustrates a second embodiment of a suitable amplifier stage.

A second embodiment of a suitable amplifier is shown in FIG. 7. The amplifier stage has input 701, includes transistors 702 and 703, and has output 704, which serves as input to the tunable output network.

Figure 8:
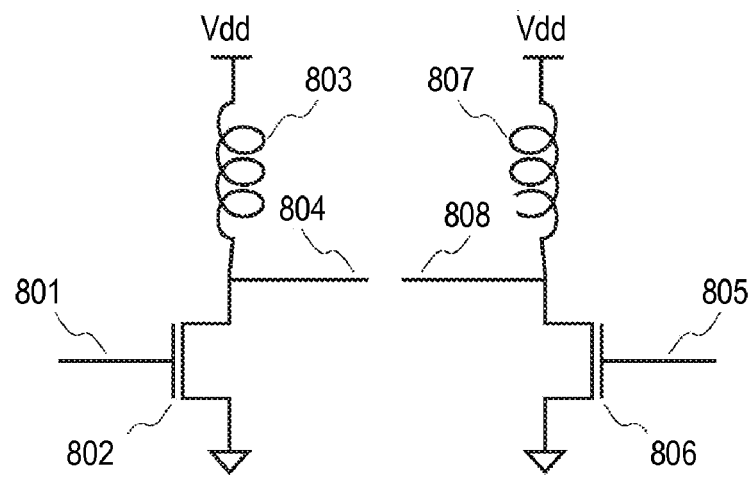
FIG. 8 illustrates a third embodiment of a suitable amplifier stage.

A third embodiment of a suitable amplifier is shown in FIG. 8. This is a differential amplifier with two halves that are operated 180 degrees out of phase from one another. The first half, receiving input 801, is formed from elements 802 and 803, while the second half, receiving input 805, is formed from elements 806 and 807. The output stage generates two outputs, 804 and 808, that form a differential signal pair and are provided as input to the tunable output network.

Tunable Output Network

An output network is a circuit that is present between the amplifier's final amplification stage and its RF output. Different applications require different functions from this network. Functions commonly performed by output networks include, but are not limited to, impedance transformation, filtering, DC blocking, power combining, phase shifting, differential-to-single-ended transformation, and harmonic termination. An output network can include passive elements such as inductors, capacitors, transmission lines, resistors, and transformers as well as active elements such as transistors, diodes, and switches.

An output network can be made into a tunable output network, such as that of block 504 in FIG. 5, by the addition of one or more adjustable elements. The term tunable output network refers to an output network whose characteristics can be varied in some way. Examples of possible tuning adjustments include, but are not limited to, a shift in the network's resonant frequency, a change in the network's transformation ratio, a change in the network's impedance, a multiplexing or demultiplexing between various output network elements, or an enabling or disabling of various output network elements. Examples of adjustable elements include, but are not limited to, varactors, variable inductors, transistors, switches, variable resistors, and diodes. Techniques such as utilizing switches to include or exclude elements or switch them into various configurations, and any other technique known in the field and/or suitable for implementing these adjustable elements may be utilized.

Figure 9:
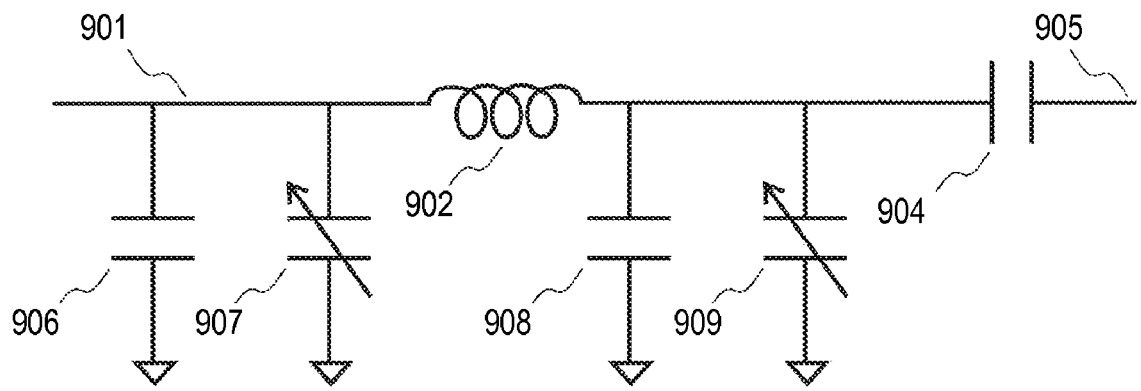
FIG. 9 illustrates a first embodiment of a tunable output network.

A variety of output networks may be utilized. A first embodiment of a tunable output network is shown in FIG. 9. Its input, 901, comes from the amplifier's output stage and its output, 905, is connected to the load. Elements 906, 902, and 908 form a pi network with fixed tuning and a fixed transformation ratio. Capacitor 904 serves as a DC block and is assumed to have a large capacitance. Any component within this network could be implemented as an adjustable element to make the network tunable. In this example, the parallel combination of fixed capacitor 906 and variable capacitor 907 form the total input capacitance, $C_{in}$, while the parallel combination of fixed capacitor 908 and variable capacitor 909 form the total output capacitance, $C_{out}$.

If the pi-network is loaded by a purely real impedance, $R_L$, connected at the output node, 905, and the loaded network has a moderate quality factor (Q), then the impedance presented by the pi-network at node 901, towards the PA output stage, $Z_T$, is purely real if the signal frequency, $f_0$, coincides with the pi-network resonant frequency.

$$f_0 = \frac{1}{2\pi \sqrt{L \frac{C_{in} C_{out}}{C_{in} + C_{out}}}} \quad (1)$$

This resonant frequency is determined by inductor, 902, and the series combination of $C_{in}$ and $C_{out}$ and can be changed by adjusting either varactor 907 or varactor 909. For moderate pi-network component quality factors, the real impedance reflected at node 1 is $$R_{in} = R_L \left(\frac{C_{out}}{C_{in}}\right)^2 \quad (2)$$

This transformed impedance also depends on varactors 907 and 909. It is clear from equations 1 and 2 that adjusting either capacitor 907 or capacitor 909 will have an effect on both the resonant frequency and the load that the output stage of the PA sees towards the pi-network. Two variable elements are included so that the resonant frequency and the transformation ratio can be set to arbitrary values.

Figure 10:
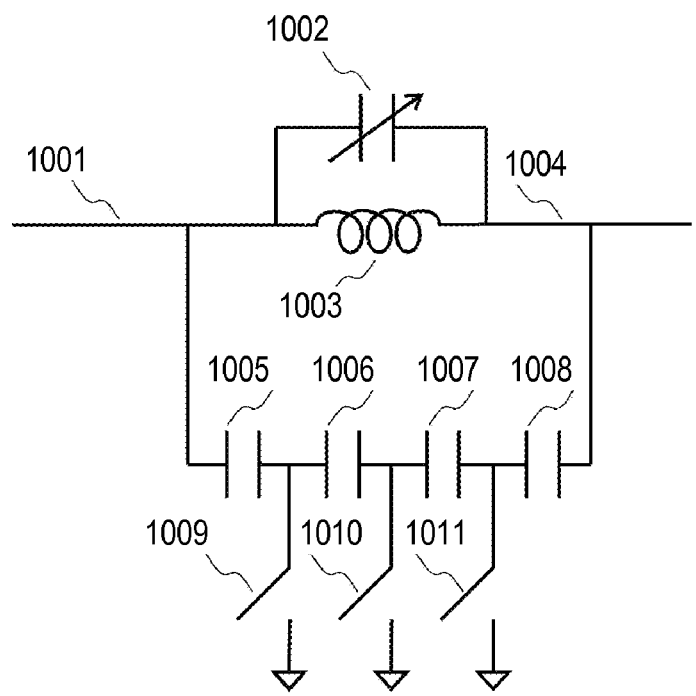
FIG. 10 illustrates a second embodiment of a tunable output network that provides independent control over the resonant frequency of the output network and the transformed load impedance.

A solution to achieving independent control over the resonant frequency of the output network, $f_0$, and the transformed load impedance, $Z_T$, is to modify the topology of the pi-network into a form that delivers this feature. An example of such a modified pi-network is shown in FIG. 10. Adjustments of variable capacitor, 1002, will only affect the resonant frequency, $f_0$, while enabling any one of the switches 1009, 1010, or 1011 will only affect the transformed load impedance, $Z_T$.

Figure 11:
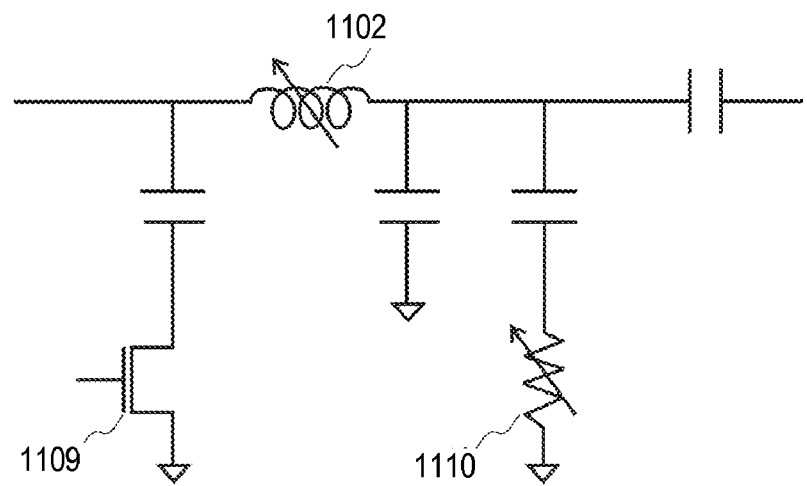
FIG. 11 illustrates a third embodiment of a tunable output network.

A third embodiment of a tunable output network is shown in FIG. 11. This output network includes three variable elements, variable inductor 1102, variable resistor 1110, and transistor 1109 that functions as either a variable resistor or as a switch.

Figure 12:
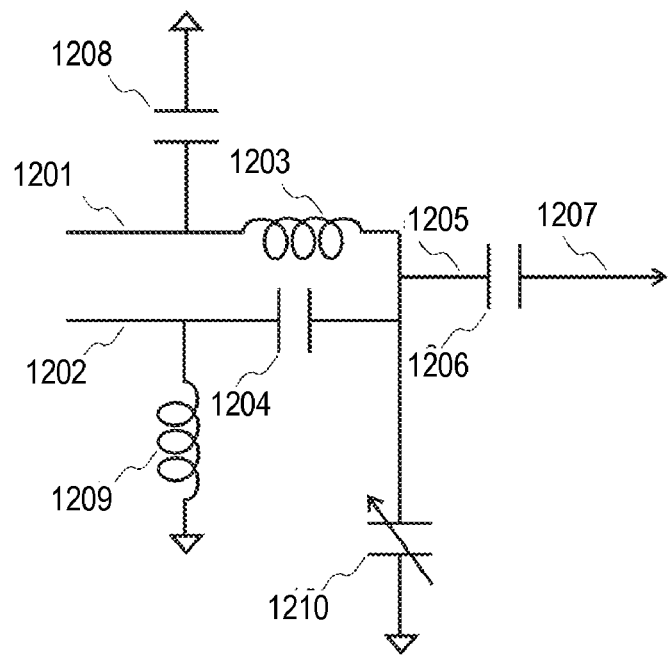
FIG. 12 illustrates a fourth embodiment of a tunable output network.

A fourth embodiment of a tunable output network, which is suited to a differential amplifier, is shown in FIG. 12. Nodes 1201 and 1202 form a differential input pair and node 1205 is connected to the load at node 1207 through DC blocking capacitor, 1206. Elements 1203, 1204, 1208, and 1209 form a lumped-element lattice balun that performs impedance transformation and differential-to-single-ended conversion. The resonant frequency of this fixed network can be changed by the addition of varactor 1210. Since this network includes only a single variable element, its resonant frequency and its transformation ratio cannot be independently adjusted.

Figure 13:
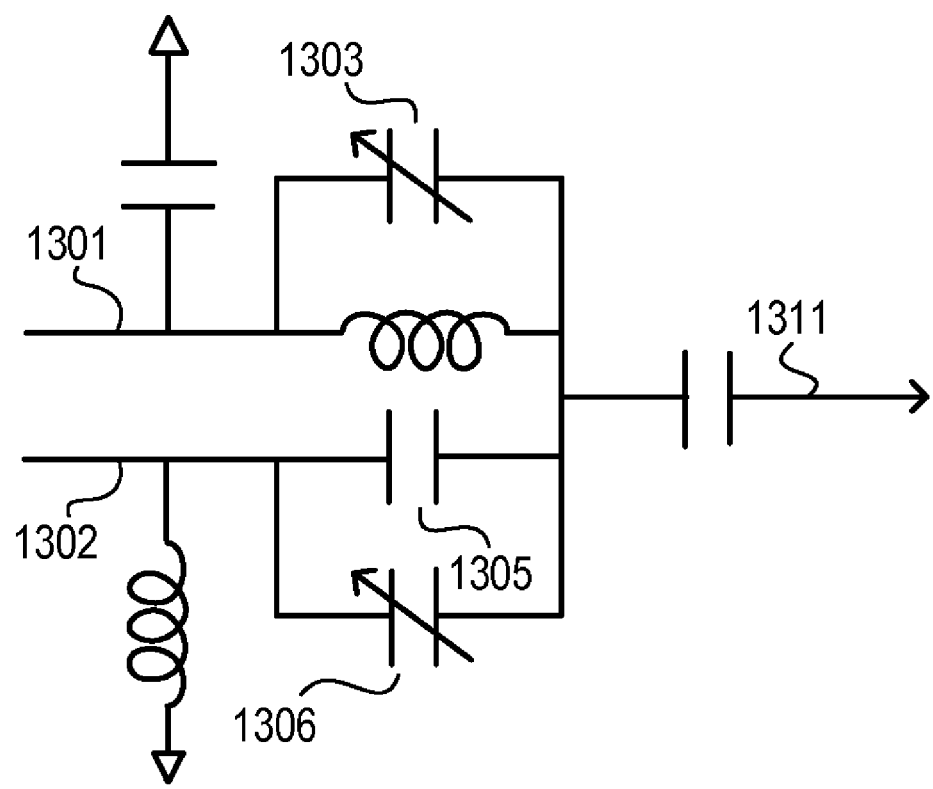
FIG. 13 illustrates another embodiment of a tunable output network.

Another embodiment of a tunable output network is shown in FIG. 13. The differential inputs to this network are nodes 1301 and 1302 and its output, 1311, is connected to a load. For purposes of illustration, assume that the output stage of the PA, which drives nodes 1301 and 1302, acts as a pair of ideal voltage sources, 180 degrees out of phase from one another. If this lumped-element lattice balun network is loaded by the purely real impedance, $R_L$, then the impedance $Z_T$ presented by the pi-network at nodes 1301 and 1302 is purely real if the signal frequency coincides with the network's resonant frequency.

$$f_0 = \frac{1}{2\pi\sqrt{L(C_3 + C_5 + C_6)}}, \quad (3)$$

where $C_3$, $C_5$, and $C_6$ are identified in FIG. 13 as 1303, 1305, and 1306, respectively.

The resonant frequency is governed by the total system capacitance and is lowered by increasing the sum of $C_3$ and $C_6$. For moderate output network component quality factors, the transformed impedance at the point of resonance is $$R_t = \frac{1}{R_L} \frac{L(C_3 + C_5 + C_6)}{(C_5 + C_6)^2} \quad (4)$$

Unlike the resonant frequency, the transformed impedance, $R_t$, is governed by a ratio of capacitances and is increased by increasing the capacitance of $C_3$ and decreasing that of $C_6$, thereby lowering the transformation ratio.

An increase in the capacitance of varactor 1303 ($C_3$) lowers the frequency at which the network is resonant and increases the circuit's transformed impedance. An increase in the capacitance of varactor 1306 ($C_6$) lowers the frequency at which the network is resonant and lowers the circuit's transformed impedance, which raises the transformation ratio.

Mismatch Detector

The purpose of the mismatch detector is to sense the difference between current conditions and target conditions and communicate the result to the tuning controller. Details of the mismatch detector depend on the desired system goals. A given device may include multiple goals and the mismatch detector may include a sensor per goal, more than one sensor per goal, and/or a sensor for multiple goals, or other appropriate variations and combinations of sensors and goals. The following examples describe some possible system-level goals and their associated sensors. When a goal is to maintain a real transformed impedance, the mismatch detector will include circuits to sense the imaginary transformed impedance or the phase angle of transformed impedance. When a goal is to keep the transformed load impedance equal to a fixed target resistance and the final amplification stage is operated as a current source, the mismatch detector may examine the voltage at the input to the transformation network as a measure of the transformed impedance. When a goal is to maintain a fixed gain from PA input to output, the mismatch detector may include circuits to sense the relevant gain or to sense some variable, such as supply voltage or bias current, to which gain is directly related. When a goal is to maximize power delivered to the load, the mismatch detector may include a search algorithm that determines where power lies compared to its maximum. When a goal is to achieve a given voltage swing or current swing at some point within the PA, the mismatch detector may calculate the difference between actual voltage or current envelopes and their desired swings. When a goal is to maintain voltage swing or current swing beneath a predetermined limit, the mismatch detector may calculate where actual voltage or current envelopes lie with respect to this limit. A wide variety of other goals and their associated sensors are possible as well.

The mismatch detector could operate either continuously, at discrete time steps, or using a combination of both. It could be analog, digital, or a combination of both, depending on the signals being sensed and the requirements of the tuning controller.

For example, in the embodiment of FIG. 5, the tuning controller has two goals: 1) maintain the imaginary part of the load impedance, $Z_T$, seen by the PA's output stage at zero and 2) maintain the real part of the load impedance, $Z_T$, equal to a fixed target resistance. Both real and imaginary mismatch detectors are used to accomplish these goals.

Imaginary Mismatch Detector

Some embodiments of the current invention include an imaginary mismatch detector as part of the overall mismatch detector. When there is an imaginary mismatch, the imaginary impedance that the amplifier's final stage sees looking into its output network may differ from its optimal value. The optimal value is the value for which the PA was designed and is usually the value at which the PA performs best using a criterion that includes a combination of power, efficiency, and linearity. The function of the imaginary mismatch detector is to measure the reactive output impedance or the phase angle of the output impedance, calculate the difference between the measured value and the desired value, and generate a control signal indicative of this result.

In many cases, optimal performance occurs when the transformed output impedance is purely real and has no reactive component. This condition has the lowest voltage and current within the amplifier's final stage for a given load power and the lowest losses in output network components. An embodiment maintains a purely real load impedance even in the face of component variations, frequency changes, load changes, temperature changes, and process variations.

Although a purely real load is usually desired, there are cases where the optimal load impedance includes a reactive component. For example, in some nonlinear or saturated PAs large-signal waveform shapes in the final amplifier stage impact efficiency and optimal efficiency may be achieved by maintaining a reactive load impedance. For these applications, the present invention can maintain the desired reactive load impedance even in the face of component variations, frequency changes, load changes, temperature changes, and process variations.

Figure 14:
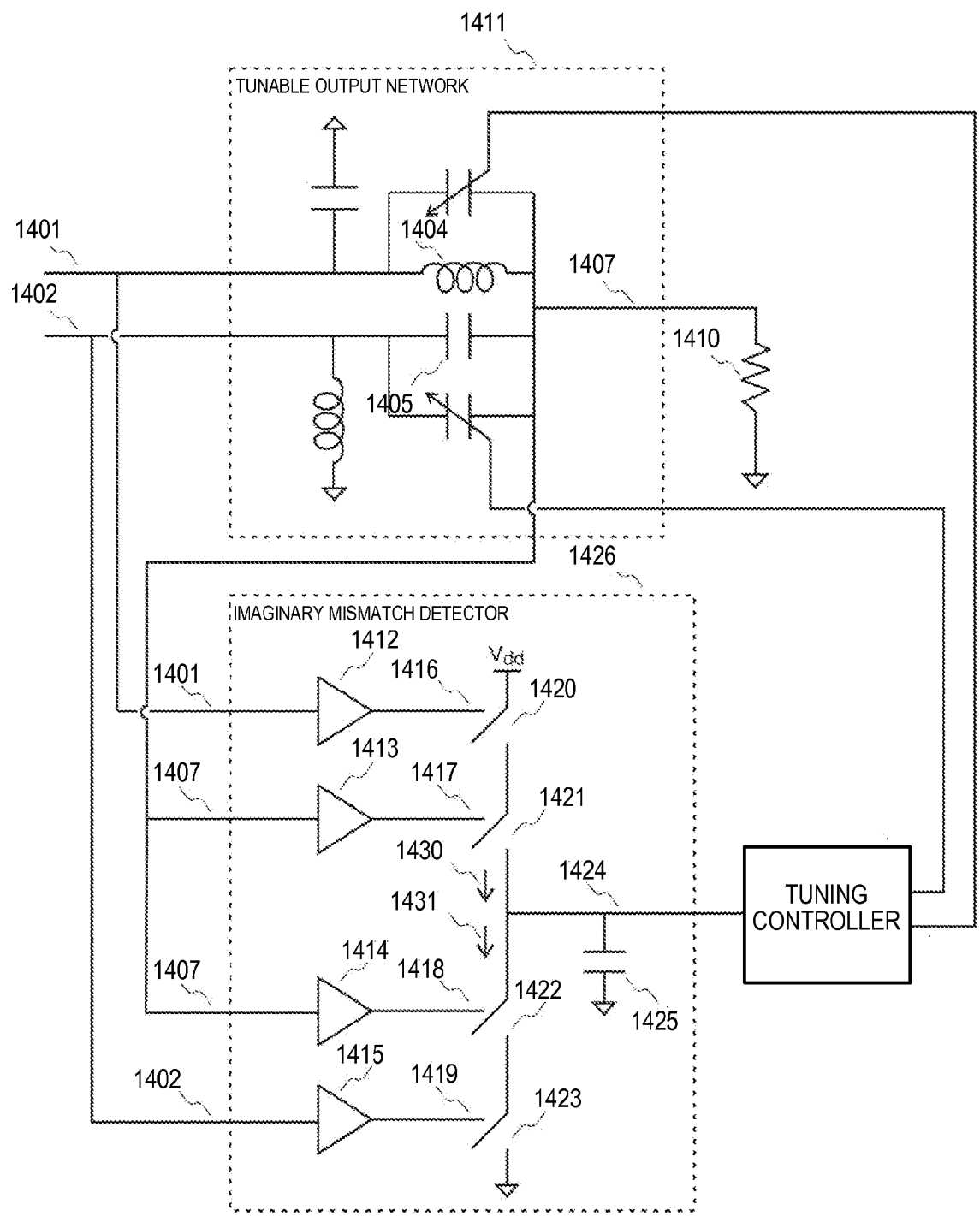
FIG. 14 illustrates various aspects of a power amplifier according to an embodiment of the invention including a first embodiment of an imaginary mismatch detector.

A first embodiment of an imaginary mismatch detector of the present invention is shown in FIG. 14. Note that the imaginary mismatch detector 1426 utilizes signals present within the tunable output network 1411, such as input signals 1401, 1402 and output signal 1407, to evaluate the imaginary mismatch. This embodiment is beneficial when the imaginary part of the PA's load is actively changing or is otherwise unknown. This may occur due to variations in antenna impedance, imperfect component values within the PA, or imperfect components within the system outside of the PA. It may also occur if the desired environment surrounding the PA presents a different imaginary impedance than that for which the PA was designed.

The differential outputs, 1401 and 1402, from the amplifier's final active stage are inputs to the tunable output network, 1411. Power across the load, 1410, is maximized when the reactive part of the differential transformed impedance across nodes 1401 and 1402 is zero. If nodes 1401 and 1402 are driven by voltage sources, then optimum power transfer to the load occurs when the phase shift from the voltage on node 1 to node 1407 is 90 degrees and the phase shift from the voltage on node 1402 to node 1407 is −90 degrees.

Figure 15:
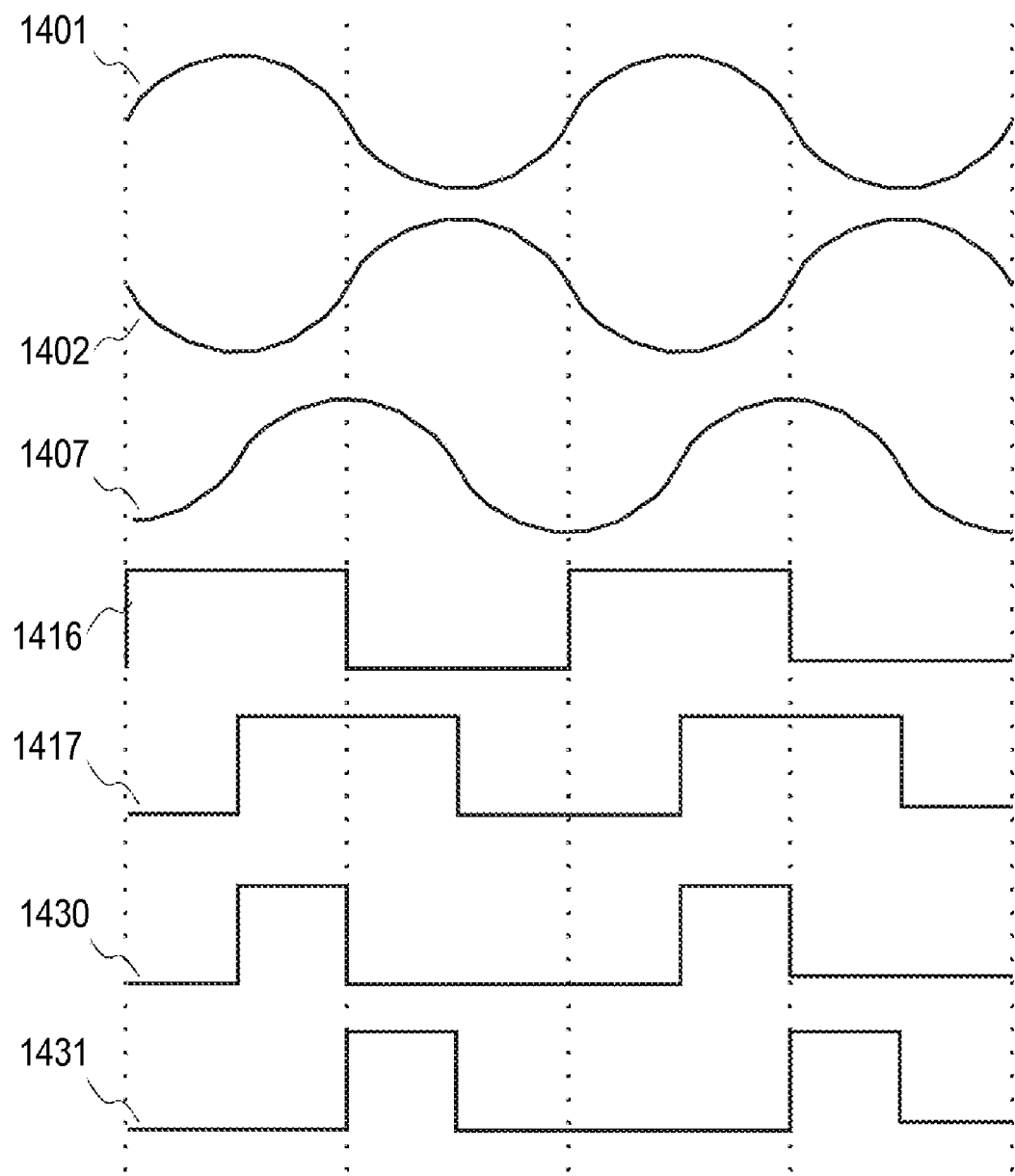
FIG. 15 shows waveforms illustrating operation of the mismatch detector of FIG. 14.

The operation of the circuit in FIG. 14 is described with reference to the waveforms shown in FIG. 15 showing signals at various nodes in FIG. 14. Imaginary mismatch detector, 1426, takes as inputs the two transformation network inputs 1401 and 1402 and the transformation network output 1407. Amplifier 1412 includes a DC block and a limiter. It generates an amplitude-limited representation of the AC component of signal 1401. In other words, its output, 1416, is a digital signal that is high when signal 1401 is above its mean and is low when signal 1401 is below its mean. Amplifiers 1413, 1414, and 1415 perform the same function with inputs 1407, 1407, and 1402, respectively. Switches 1420, 1421, 1422, and 1423 conduct when their control inputs 1416, 1417, 1418, and 1419 are high and do not conduct when their control inputs are low. For proper operation, these switches should have some non-zero resistance. Capacitance 1425 on node 1424 is discharged (current 1431) only when switches 1422 and 1423 are on simultaneously and is charged (current 1430) only when switches 1420 and 1421 are on simultaneously. If capacitor 1425 is large, then node 1424 contains a low-pass filtered representation of the relative phase shifts across transformation inductor 1404 and transformation capacitor 1405. If signal 1407 is closer in phase to 1401 than it is to 1402, then switches 1420 and 1421 will conduct more current than switches 1422 and 1423 and the voltage on node 1424 will be increased. If signal 1407 is closer in phase to 1402 than to 1401, then the voltage on node 1424 will be decreased.

Figure 16A:
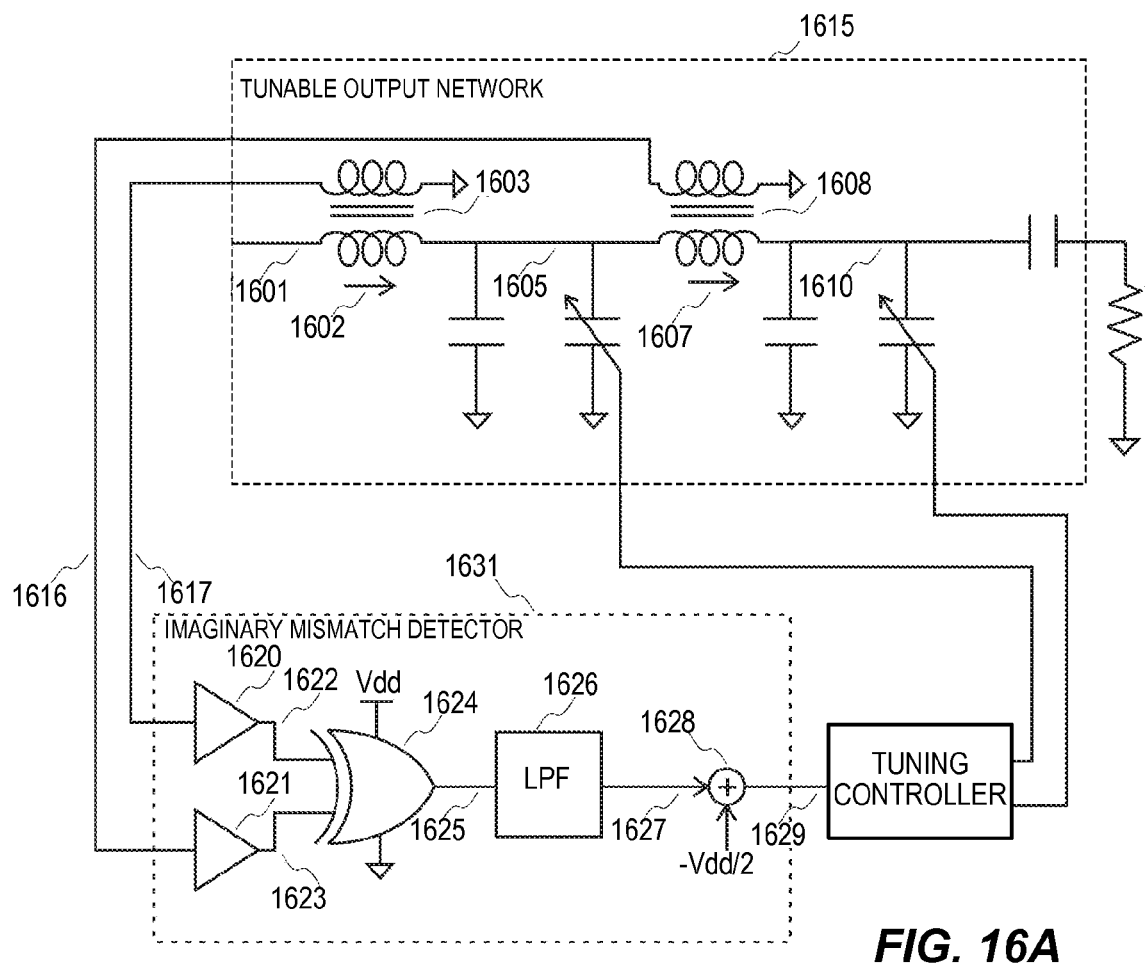
FIG. 16A illustrates various aspects of a power amplifier according to an embodiment of the invention including a second embodiment of an imaginary mismatch detector.
Figure 16B:
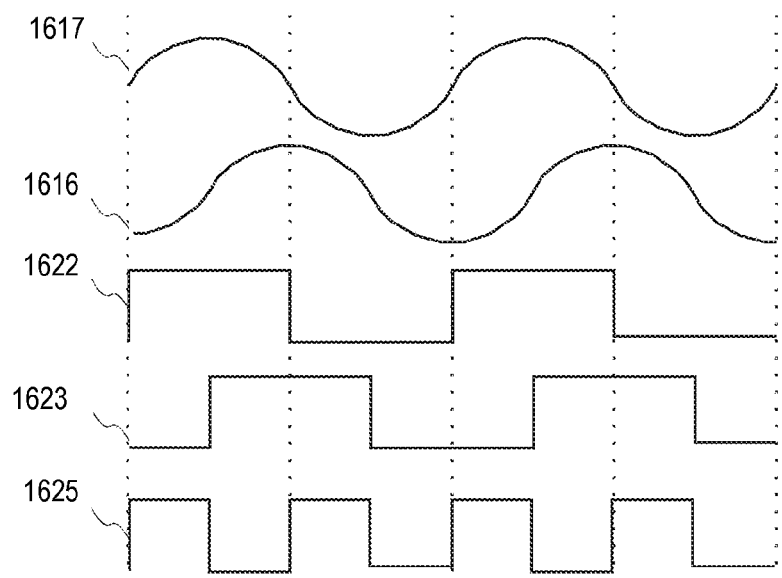
FIG. 16B shows waveforms illustrating operation of the mismatch detector of FIG. 16A.

A second embodiment of an imaginary mismatch detector of the present invention is shown in FIG. 16A and associated waveforms shown in FIG. 16B. In this embodiment, the output 1601, from the amplifier's final stage, is input to the tunable output network, 1615. At the network's resonant frequency, the phase relationship of voltages at nodes 1605 and 1610 and that of currents 1602 and 1607 are known and independent of component values. For example, at resonance, the inductor current, 1607, is exactly −90 degrees with respect to current 1602 and this phase relationship can be detected by the imaginary mismatch detector, 1631. Transformers 1603 and 1608 generate voltages 1617 and 1616 that are proportional to currents 1602 and 1607, respectively.

Note that the imaginary mismatch detector 1631 utilizes signals present within the tunable output network 1615, signals 1616, 1617, which correspond to currents 1602 and 1607, to evaluate the imaginary mismatch. The imaginary mismatch detector, 1631, receives signals 1617 and 1616 as inputs and creates the output signal 1629, which has a level corresponding to the difference between the relative phase of signals 1617 and 1616 and the expected relative phase when the tunable output network is at resonance. Amplifiers 1620 and 1621 generate an amplitude-limited representation of the AC component in signals 1617 and 1616, respectively. The digital XOR gate, 1624, receives the outputs of amplifiers 1620 and 1621 and generates signal 1625 that is fed into a low-pass filter, 1626. The quantity Vdd corresponds to the supply voltage of the XOR gate, 1624. The low-pass filter output, 1627, is sent to block 1628, which subtracts the DC quantity Vdd/2.

When the relative phase relationship of signals 1617 and 1616 is exactly −90 degrees, signal 1625 is rectangular with 50% duty-cycle, swinging between VDD and ground. In this case, the DC content of signal 1625 is Vdd/2 and signal 1629 is zero. When the relative phase relationship of signals 1617 and 1616 differs from −90 degrees, signal 1629 will be non-zero and its sign will indicate the direction of the relative phase shift. For example, signal 1629 will be greater than zero if the phase of 1616 is further than 90 degrees delayed with respect to 1617, in which case the phase of current, 1607, is further than 90 degrees delayed with respect to the current, 1602. Signals at nodes 1622 and 1623 are shown in FIG. 16B.

Real Mismatch Detector

Some embodiments of the current invention include a real mismatch detector, whose purpose is to measure the real part of the transformed impedance, calculate the difference between its value and the desired value, and generate an output representing this quantity. This can be accomplished in a number of ways, depending on what metric the PA is trying to maintain. For example, when the goal is to maintain real power levels at the PA's output at a fixed level, then this power quantity can be measured and compared to its desired level. In another example, when the goal is to maintain gain from PA input to output at a fixed level, then the gain can be measured and compared to its desired level. As a final example, when the goal is to maximize PA output power, then the output power can be measured under different conditions and an intelligent search algorithm can determine when power is maximized.

There are a number of reasons why it might be desirable to maintain voltage or power gain at a fixed level. First, variations in gain of the PA's active stages as a function of power level cause amplitude distortion. The present invention can remove amplitude distortion by compensating for a change in active stage gain with an inversely proportional change in transformation ratio. Second, a reduction in the PA's supply voltage, such as would occur as a battery discharges, results in a reduction in the maximum power that it can produce. When the PA's output stage operates as a voltage source, then a decrease in supply voltage translates directly into a decrease in load voltage. When the PA's output stage operates as a current source, then a decrease in supply voltage translates into a reduction in the voltage at which compression limits linearity. In either case, the present invention can restore maximum PA power, despite a supply voltage decrease, by adjusting a combination of the transformation ratio and stage bias currents.

Figure 17:
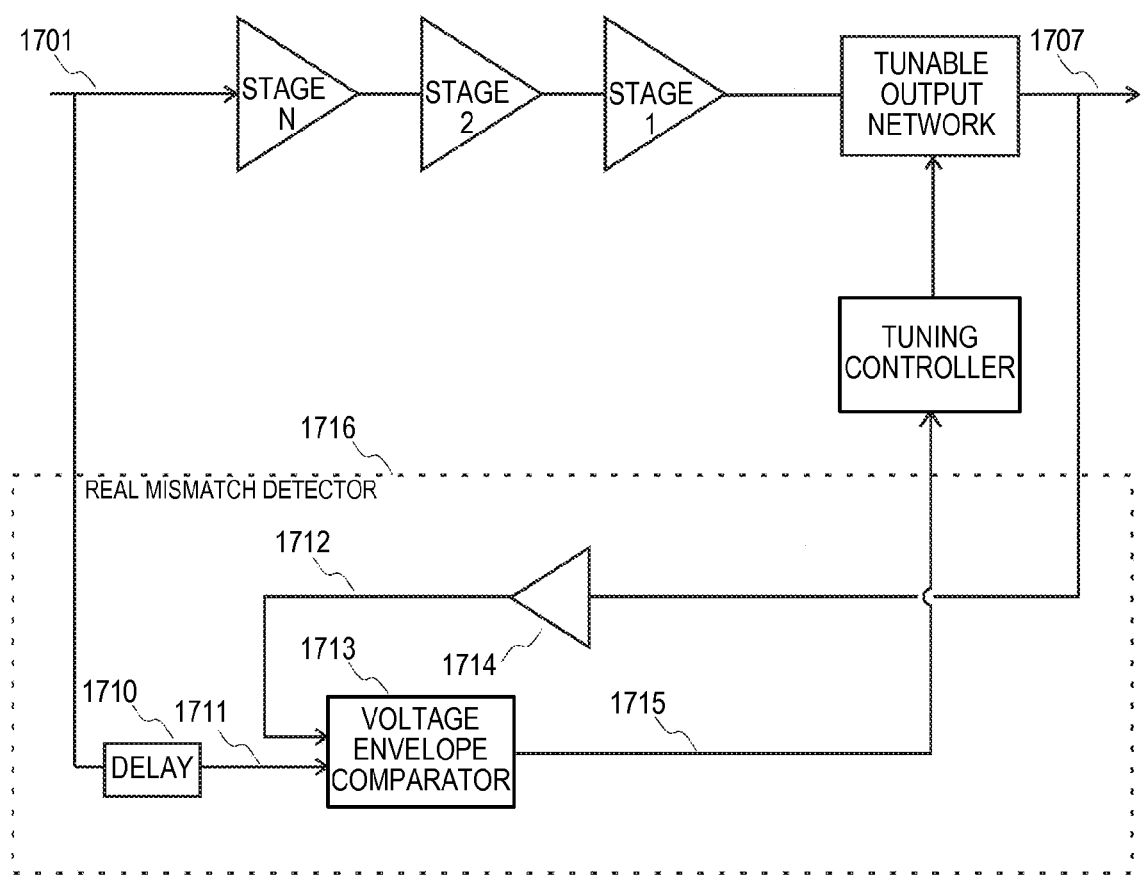
FIG. 17 illustrates various aspects of a power amplifier according to an embodiment of the invention including an embodiment of a real mismatch detector.

One embodiment of a real mismatch detector of the present invention is shown in FIG. 17. This embodiment is suited for applications where the impedance of the load is fixed and known and where the goal is to maintain voltage gain through the PA at a fixed level. In this case, the real mismatch detector only needs to measure input and output voltages to determine power gain through the PA. The voltage at the PA output, 1707, is fed to the real mismatch detector, 1716, and is divided in amplifier 1714 by a factor equal to the desired PA voltage gain (e.g., attenuation=1/desired PA voltage gain). That division could be accomplished by techniques well known in the field such as a capacitive voltage divider. Thus, the real mismatch detector 1716 utilizes signals present within the tunable output network, i.e., output 1707 and a signal from within a power amplifier stage (stage N), to generate the mismatch signal 1715. The voltage at the PA's RF input, 1701, is delayed in block 1710 by an amount corresponding to the delay through the PA chain from nodes 1701 to 1707. The envelopes of signals 1711 and 1712, representing the input and output RF voltages, are compared in a voltage envelope comparator, 1713. The output, 1715, of the voltage envelope comparator contains a measure of whether the voltage gain through the PA is larger or smaller than its desired value.

Figure 18:
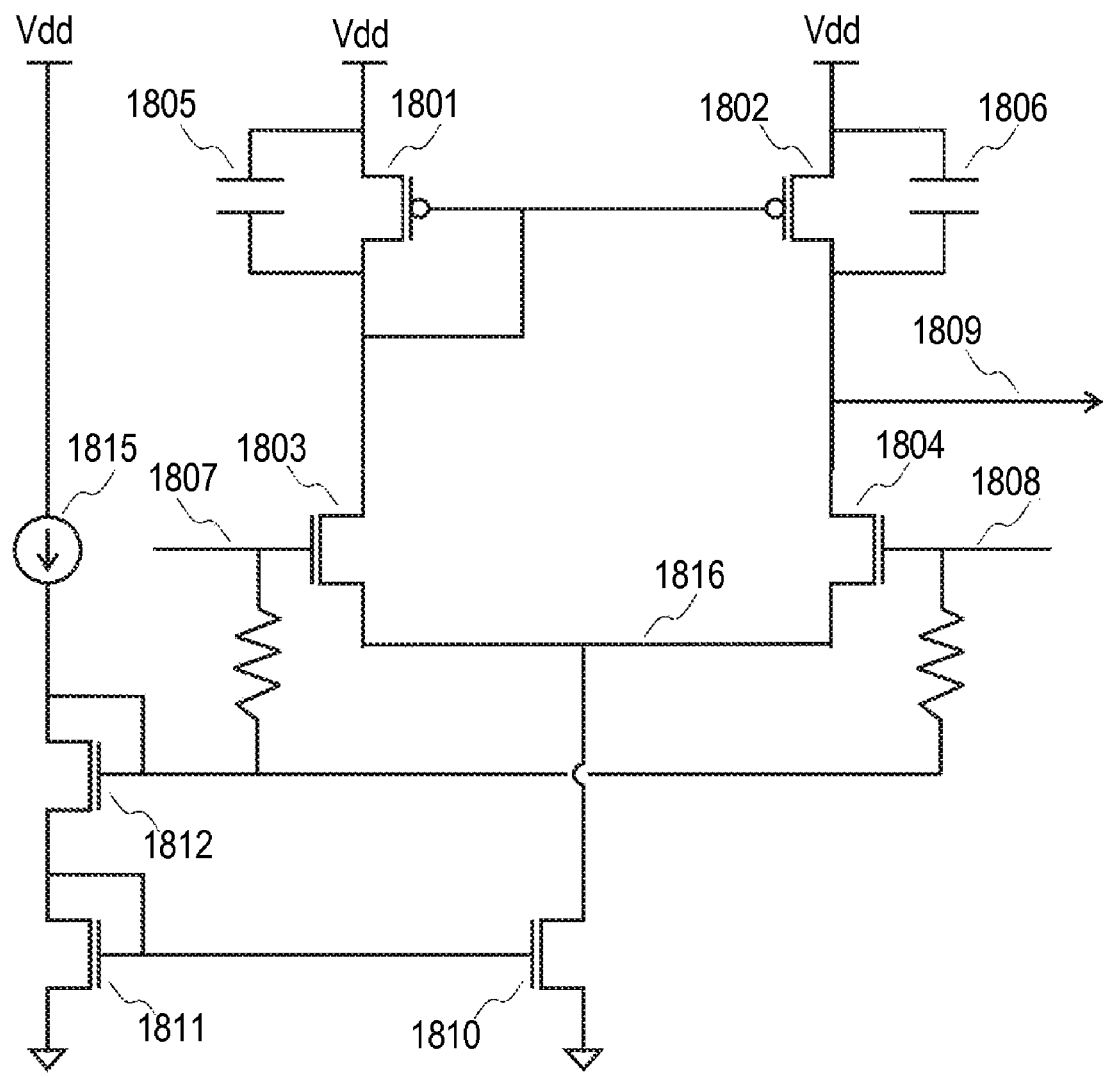
FIG. 18 illustrates an example of a voltage envelope comparator used in the real mismatch detector of FIG. 17.

An example of a voltage envelope comparator, such as that of block 1713 in FIG. 17, is shown in FIG. 18. Devices 1801, 1802, 1803, 1804, and 1810 form a differential amplifier with output 1809. Current source 1815 sets bias current in the differential amplifier through the current mirror of devices 1810 and 1811. Diode connected device 1812 sets the DC bias at nodes 1807 and 1808 one diode drop above node 1816, which assures that transistors 1803 and 1804 are biased right at their threshold. RF voltages on the circuit's inputs, 1807 and 1808, are rectified at the gates of transistors 1803 and 1804. The large capacitors 1805 and 1806 low pass filter the resulting RF currents and capture their envelope.

When the PA's load is not known or can vary, a real mismatch detector needs to know both voltage and current and their relative phases at RF to calculate power. Theoretically, voltage and current at the PA's output could be multiplied at RF, voltage and current at the PA's input could be multiplied at RF, and the envelopes of each of these results could be compared. In practice these multiplications are difficult to perform accurately at RF. A preferred approach exists if the PA also includes an imaginary mismatch detector loop that forces the imaginary part of the load to be zero. In this case, it is known that voltage and current at the PA's output are in phase so that output power can be calculated by multiplying the envelope of voltage with the envelope of current using a low-frequency multiplier.

Figure 19:
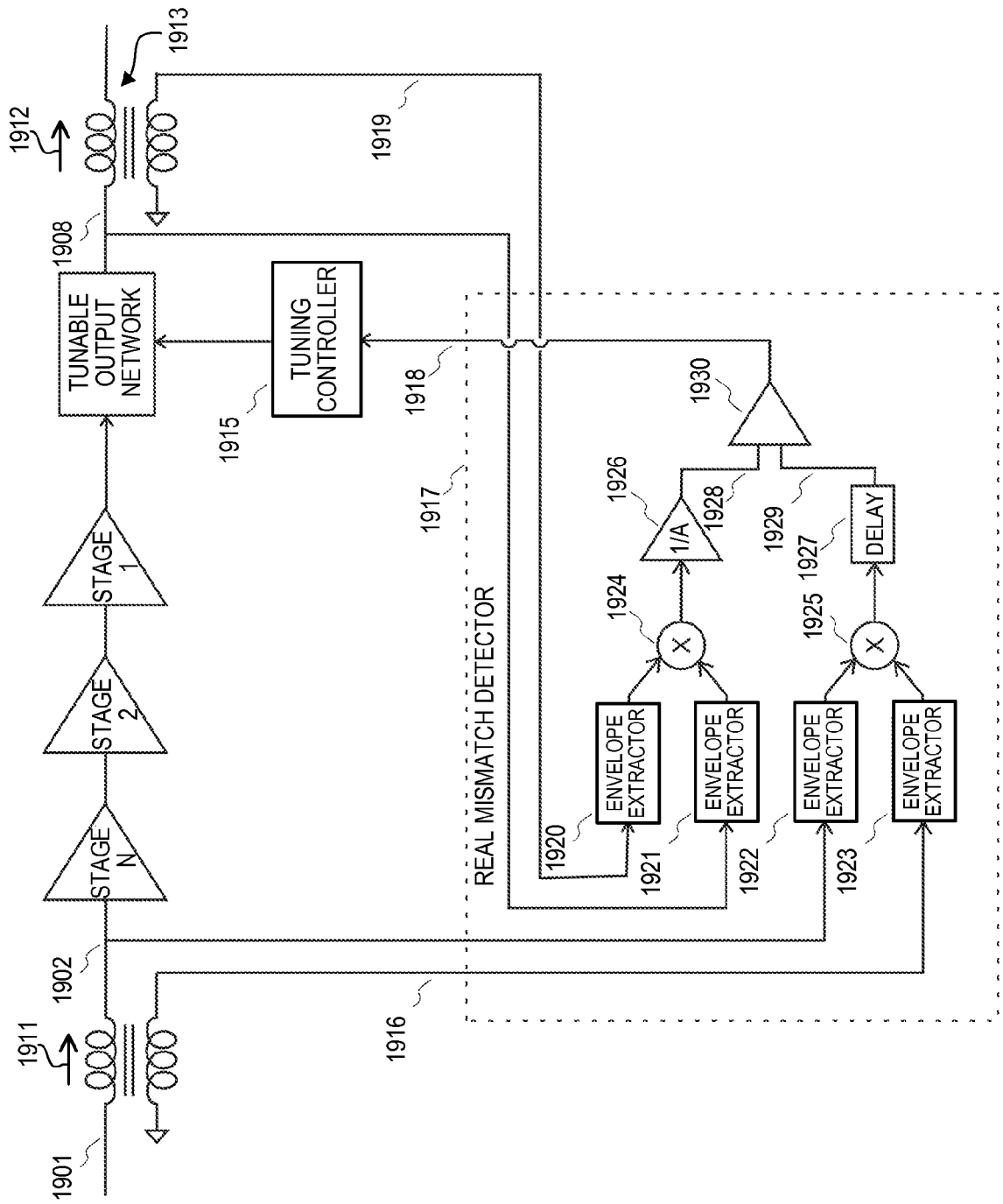
FIG. 19 illustrates various aspects of a power amplifier according to an embodiment of the invention including another embodiment of a real mismatch detector.

FIG. 19 shows an embodiment of a real mismatch detector of the present invention for use when the PA's input impedance and its load are both known to be purely real but their values are unknown and for the goal of controlling power gain rather than voltage gain. A real mismatch detector such as that of FIG. 19 provides similar advantages to that of FIG. 17 except that it is controlling power rather than voltage. It can reduce amplitude distortion, maintain power levels at lower supply voltages, and reduce power variations due to supply voltages. It can also perform all of these functions even when the load's real part is actively changing or otherwise unknown.

The real mismatch detector, 1917, uses the PA's RF input voltage, 1902, and a representation, 1916, of its input current, 1911, to generate a measure of the RF input power. Thus, the real mismatch detector 1917 bases its generation of mismatch signals 1918 on signals present within the tunable output network, i.e., output 1908, on input signal 1902, which is utilized within power amplifier stage N, and signals corresponding to input and output currents of the power amplifier stage and the output network, respectively. The envelopes of input voltage and input current are calculated in envelope extractors 1922 and 1923, respectively, and then these quantities are multiplied together in multiplier 1925. The result is then delayed in delay element 1927 by an amount equal to the delay through the PA chain from nodes 1901 to 1908. Simultaneously, the real mismatch detector uses the RF output voltage, 1908, and a representation, 1919, of its RF output current, 1912, to generate a measure of the RF output power. Note that the circuit 1913 to sense the output current 1912 is shown separate from the tunable output network for convenience of illustration. The envelopes of output voltage and output current are calculated in envelope extractors 1921 and 1920, respectively, and then multiplied together in multiplier 1924. The result is then attenuated in amplifier 1926 by a factor equal to the desired power amplifier power gain. Finally, results 1929 and 1928, representing the input and output powers, are compared in comparator 1930 and the result, 1918, is provided to the tuning controller, 1915.

The Tuning Controller

The purpose of the tuning controller is to combine information from sensors within the mismatch detector, and decide how to best adjust elements within the tunable output network to achieve the desired system goals. The tuning controller could be either analog or digital or a combination of both and could operate either continuously or discrete time or a combination of both.

When the tuning controller's algorithm is naturally composed of analog quantities and when quantities to be controlled should be continuously monitored, the tuning controller can operate continuously using an analog signal processing system. For example, consider a PA whose goal is to insure that the voltage across certain transistors remains less than a maximum that is set by the semiconductor technology being used. This control loop is readily implemented as a simple continuous-time analog circuit akin to a comparator that is capable of almost instantaneous reaction to the limit condition being met. In this case, the tuning controller loop and its associated mismatch detector are continuously active whenever the PA is powered up.

Sometimes the tuning controller's algorithm is best suited toward analog quantities but quantities to be controlled should be updated in a discrete-time manner. In this case, the tuning controller can operate at discrete time steps in an analog fashion using clocked sample-and-holds. This might be the case, for example, in a PA whose goal is to insure that the imaginary part of the load is zero but where the output network's tuning can only be updated during set time intervals in between transmissions.

When the tuning controller's algorithm naturally uses digital quantities and digital algorithms, it can operate at discrete time steps using a digital program executed by custom hardware or performed by a general purpose microprocessor. The ability to make use of discrete-time signal processing within the tuning controller opens up a wealth of possibilities wherein complex adjustment algorithms, such as piecewise linear control or non-linear control, can be used. As an example, consider a PA whose goal is to insure that output power is independent of component values, temperature, and age. These factors change very slowly. This control loop only occasionally needs to update mismatch measurements and apply corrections. Such a tuning controller can be powered down most of the time and only powered up when an update is to be performed. Memory elements can hold state variables in between control loop updates.

Sometimes the tuning controller's algorithm is best implemented using a combination of analog and digital signals and quantities to be controlled should be updated in a discrete-time manner. This might be the case, for example, in a PA whose goal is to insure that the imaginary part of the load is zero and where the mismatch detector is best implemented as an analog circuit but where the output network's tuning is adjusted using digitally-controlled varactors. The tuning controller may include an analog-to-digital converter to translate signals between the continuous-time analog domain and the discrete-time digital domain.

For purposes of example, consider an embodiment of the tuning controller that has two goals: 1) maintain the phase angle, or imaginary part, of the transformed load impedance, $Z_T$, at zero and 2) maintain the magnitude, or real part, of $Z_T$ equal to a fixed target. In this embodiment, both real and imaginary mismatch detectors are included. The real mismatch detector's output is represented by R and the imaginary mismatch detector's output is represented by I. R and I can be electrical quantities, such as voltages or currents, or digital quantities. The relations that govern R and I can be a continuous function, such as a constant proportionality factor or a non-linear equation. Or these relations can be a discontinuous function, such as a "sgn" function or a multi-level quantizer.

The tuning controller reacts to any deviations of R and I from their prescribed targets, $R_T$ and $I_T$, respectively, and controls variable elements within the tunable output network so as to minimize these deviations. If the tunable output network used is the pi-network of FIG. 9, then the tuning controller will take corrective measures by adjusting capacitors 907 and 909. However, it can be seen from equations (1) and (2) that correcting for either one of these goals by independently adjusting either capacitor 907 or capacitor 909 will affect the other goal. In order to achieve independent control over the resonant frequency of the output network, $f_0$, and the transformed load impedance, $Z_T$, the tuning controller can simultaneously adjust capacitor 907 and 909 in such a manner such that either the ratio $$\frac{C_{out}}{C_{in}}$$

remains constant during $f_0$ adjustments or the quantity $$\frac{C_{in} C_{out}}{C_{in} + C_{out}}$$

remains constant during $Z_T$ adjustments.

If the tunable output network used is that of FIG. 10, then the tuning controller can independently control the resonant frequency, $f_0$, and the transformed load impedance, $Z_T$. Independent control can be advantageous because it can be hard to stabilize a control loop with two variables. A tuning controller algorithm for this output network is described with reference to FIG. 20. Blocks 2018, 2019, and 2020, together with the tunable output network, 2021, form a continuous-time closed-loop negative feedback loop.

The imaginary mismatch detector, 2018, can be implemented in a manner similar to that of FIG. 16. It generates electrical signal, I, at its output, 2015. I is a voltage that is governed by $$I = k_M [\phi(V_1) - \phi(I_{32})], \quad (5)$$

where $k_M$ is a proportionality factor measured in units of Volts/rad, $\phi$ represents phase, $V_1$ is the voltage at node 2001, and $I_{32}$ is the current, 2032, into the tunable output network, 2021. Current $I_{32}$ is sensed by transformer 2012 and presented as a voltage on node 2013. The goal is to keep the voltage $V_1$ and the current $I_{32}$ in phase with each other, corresponding to a purely real transformed impedance. Equation (5) can be rewritten as $$I = k_M \cdot \{\phi(V_1) - [\phi(V_{13}) - \frac{\pi}{2}]\}, \quad (6)$$

which is a function of the voltages on nodes 2001 and 2013 and the 90-degree phase advancement produced by transformer 2012. In this case, the goal is to keep the voltage $V_1$ and $V_{13}$ 90 degrees apart in phase.

Signal I on node 2015 is applied to the input of the stability compensation filter, 2019, which creates a conditioned version of I at its output, 2016. The stability compensation filter block usually implements a Proportional-Integral-Differential controller transfer function. In its simplest implementation, it can be a single-pole low-pass filter with the transfer function $$H(s) = \frac{k_H}{1 + \frac{s}{\omega_0}}, \quad (7)$$

where $k_H$ is the DC gain of the low-pass filter and $\omega_0$ is the pole radian frequency. Alternatively, the pole could be located at the origin, thus transforming the low-pass filter into an integrator of transfer function $$H(s) = \frac{k_H}{s}. \quad (8)$$

In this case, $k_H$ is the integrator unity-gain bandwidth. The presence of an integrator inside the closed-loop negative feedback insures that, in steady-state, the signal at the input of the integrator, the mismatch, is annulled.

The error amplifier, 2020, has a gain $k_A$ and is designed to translate the signal range of node 2016 at the output of the stability compensation filter to a signal range that is appropriate for the control input 2017 of varactor 2002. In steady-state, the negative feedback loop will converge to a condition where the error amplifier generates whatever control voltage is necessary on the varactor to position the output network's resonant frequency $f_0$ at the RF signal frequency.

The operation of the imaginary loop described above does not affect the output network's transformation ratio. This quantity is controlled by a secondary negative feedback loop formed by blocks 2025, 2026, 2027, and 2028. In this embodiment the real mismatch detector, 2025, senses the voltage gain A, defined as $V_1/V_{22}$ through the PA's active stages, where $V_{22}$ is the voltage on node 2022, and generates the digital signal R on bus 2023.

Figure 20:
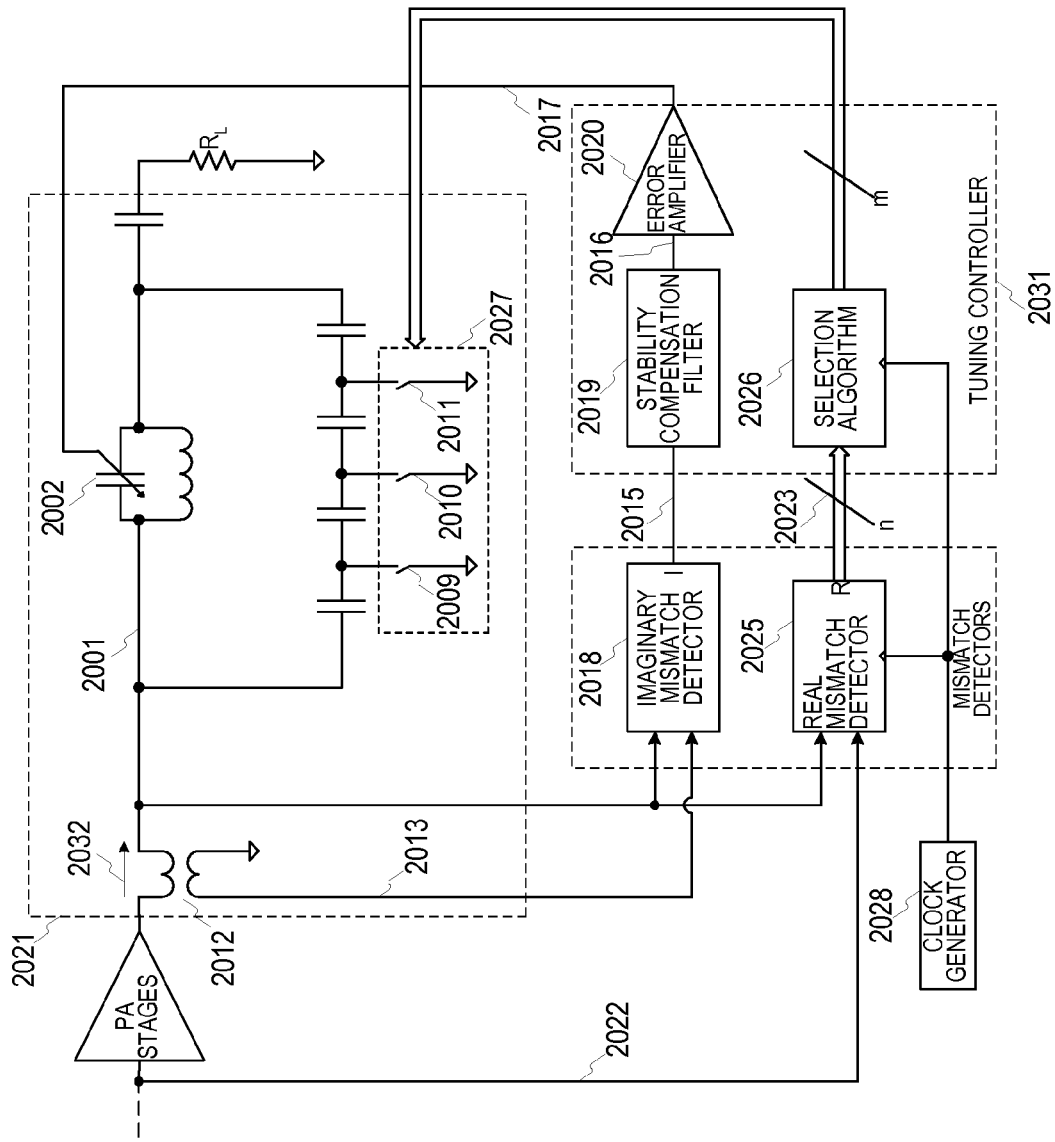
FIG. 20 illustrates various aspects of a power amplifier including a tuning controller, mismatch detectors, amplifier stages, and an output network, according to an embodiment of the invention.

The digital output, 2023, from the real mismatch detector of FIG. 20 is delivered to the tuning controller, 2031. The tuning controller's job is to translate this signal into controls that select and enable switches within the switch-bank, 2027, in a way that results in an actual PA gain, A, equal to the desired PA gain, $A_T$. Only one switch in the switch bank should be enabled at a time. The tuning controller 2031 includes a digital state machine, 2026, which implements this function. An example of pseudo-code for the controller's selection algorithm is given below. R1 is a constant that represents the breakpoint between three different tuning regions, each tuning region corresponding to a different switch configuration. In the code below, switches 9, 10, 11 correspond to switches 2009, 2010, and 2011, respectively and R is the output of the real mismatch detector.

```
if (R <= -R1)
{
   Switch 9 = ON;
   Switch 10 = OFF;
   Switch 11 = OFF;
}
else if ((R > -R1) and (R <=R1) )
{
   Switch 9 = OFF;
   Switch 10 = ON;
   Switch 11 = OFF;
}
else if (R > R1)
{
   Switch 9 = OFF;
   Switch 10 = OFF;
   Switch 11 = ON;
}
```

Figure 21:
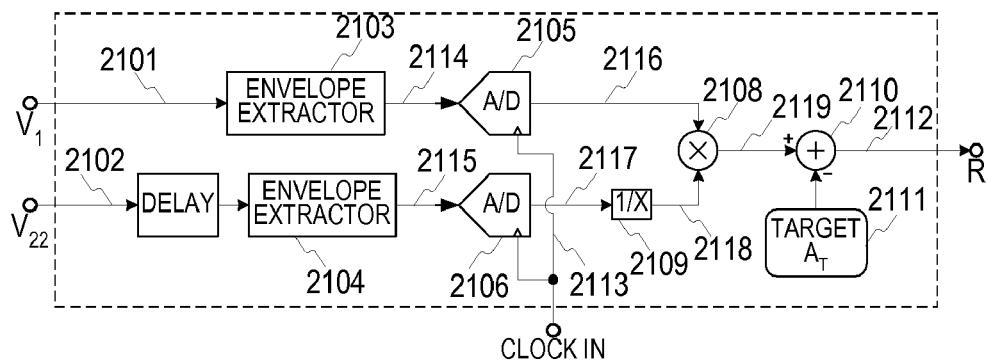
FIG. 21 illustrates an embodiment of a real mismatch detector.

One possible embodiment of the real mismatch detector is presented in FIG. 21. Envelope extractors 2103 and 2104 generate voltages 2114 and 2115 that are proportional to the envelopes of the input signals 2101 and 2102. Voltages 2114 and 2115 are subsequently sampled and digitized by analog-to-digital converters 2105 and 2106. The clock for these operations is supplied on node 2113. Digital signal 2117 is reciprocated by block 2109 to generate signal 2118. The multiplier 2108 calculates the product of signals 2116 and 2118, which equals the ratio, A, of the amplitudes of input voltages to the real mismatch detector. The digital target for A, 2111, referred to as $A_T$, is subtracted from the multiplier's result, 2119 in digital subtraction circuit, 2110 and the result, 2112, is provided at the real mismatch detector's output.

A second embodiment of a tuning controller is presented for the case where the lumped-element lattice balun of FIG. 13 is used as the tunable output network. A change in capacitance of either of the varactors 1303 or 1306 will change both the resonant frequency, $f_0$, as well as the transformed load, $Z_T$. However, $Z_T$ can be changed without effecting $f_0$ if any modification of capacitor 1306 is met with an equal but opposite modification of capacitor 1303 so that the total system capacitance is maintained constant. A simple solution does not exist in the opposite direction, to adjust $f_0$ without affecting $Z_T$, but as long as an $f_0$ adjustment is immediately followed by a correction to $Z_T$, arbitrary values can be targeted for $f_0$ and $Z_T$.

Figure 22:
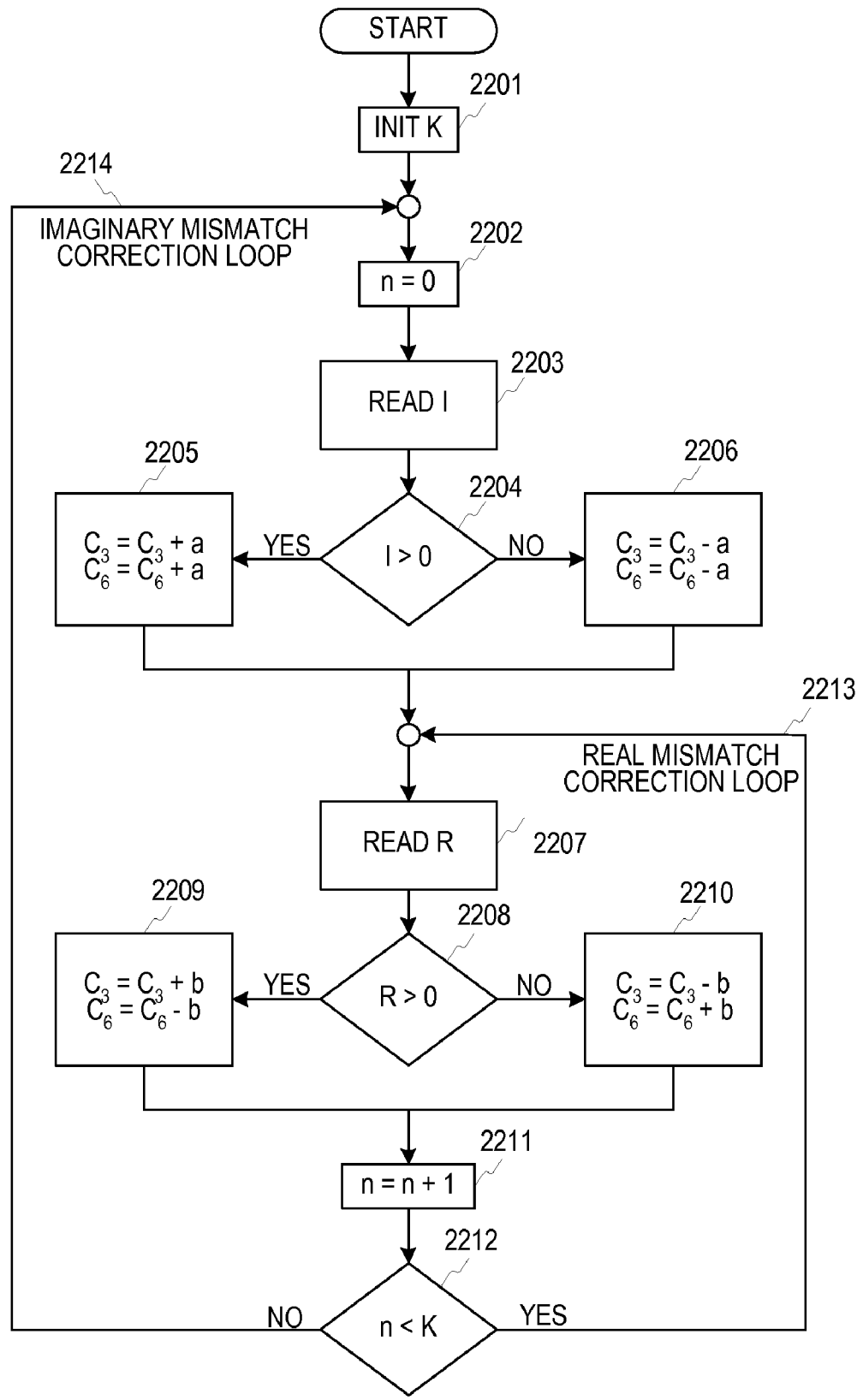
FIG. 22 illustrates operation of an exemplary tuning algorithm.

An example of a tuning algorithm that does this is shown FIG. 22. The algorithm is designed to make discrete adjustments to varactors 1303 and 1306, which determined $f_0$ and $Z_T$, with the ultimate goal of bringing the real and imaginary mismatch quantities R and I to 0. The algorithm follows any adjustment of $f_0$ by K adjustments of $Z_T$, where K is a predefined number. The tuning algorithm controls S for imaginary mismatch adjustments, where $$S=(C_5+C_6)+C_3, \quad (9)$$

where $C_3$, $C_5$, and $C_6$ are capacitances 1303, 1305, 1306 in FIG. 13. The tuning algorithm controls D for real mismatch adjustments, where $$D=(C_5+C_6)-C_3. \quad (10)$$

Upon being started, the algorithm initializes the constant K in step 2201 and enters the imaginary mismatch correction loop. It resets counter n in step 2202 and in step 2203 reads the digital quantity I, which is positive when $f_0$ is higher than its target. Depending on the sign of I at step 2204, the algorithm chooses to either increment both C3 and C6 by the same amount, a, or to decrement both C3 and C6 by the same amount, a. The value a may be a fixed quantity or it may be related to the magnitude of I. If step 2205 is chosen, then the resonant frequency, $f_0$, is decreased, whereas if step 2206 is chosen, then the resonant frequency, $f_0$, is increased.

The algorithm then enters the real mismatch correction loop and in step 2207 reads the digital quantity R, which is positive when $Z_T$ is smaller than its target. Depending on the sign of R at step 2208, the algorithm chooses either step 2209 or 2210. Step 2209 increases $Z_T$ by incrementing C3 by an amount b and decrementing C6 by the same quantity. Step 2210 decreases $Z_T$ by decrementing C3 by an amount b and incrementing C6 by the same quantity. The value b may be a fixed quantity or it may be related to the magnitude of R. Every time a real impedance correction is made, counter n is incremented in step 2211 and is compared to a limit K in step 2212. A total of K cycles, where $K \geq 1$, of the real mismatch correction loop are performed for every 1 cycle of the imaginary mismatch correction loop. This is to assure that changes in $Z_T$ caused by steps 2205 or 2206 can be undone. After K iterations of the real mismatch correction loop, the algorithm returns via branch 2214, to the beginning of the imaginary mismatch correction loop.

Figure 23:
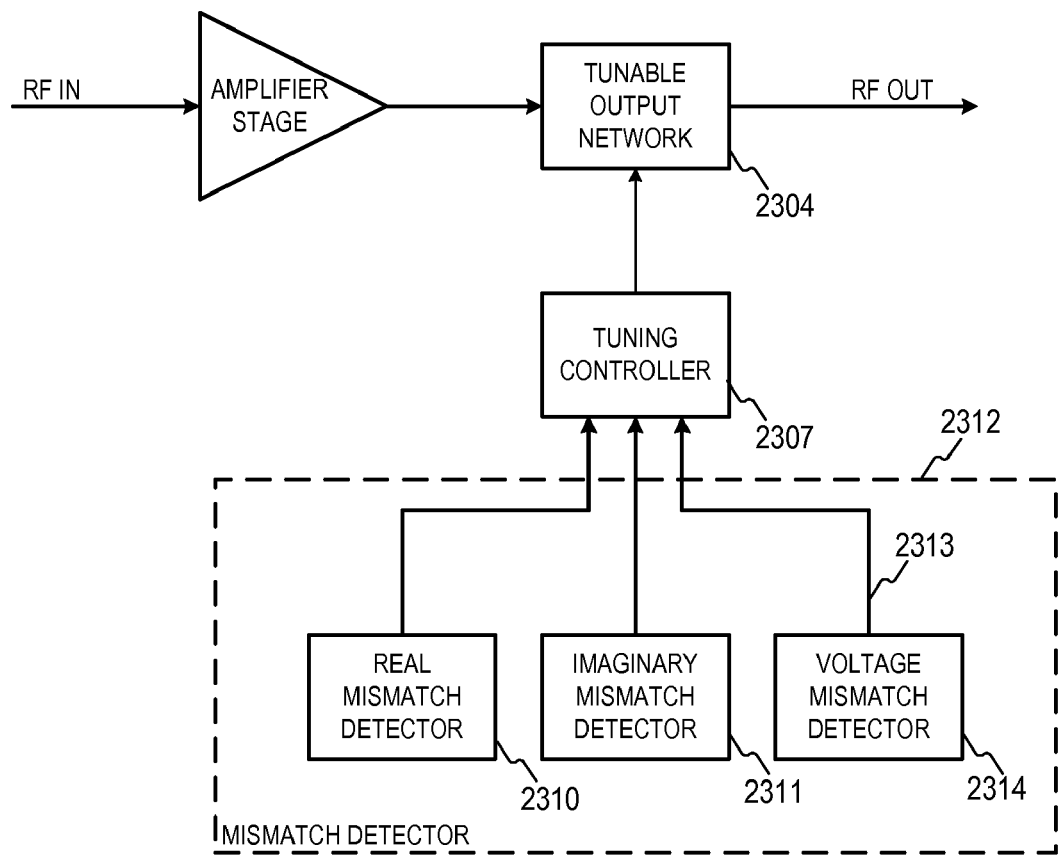
FIG. 23 illustrates an exemplary embodiment of a power amplifier according to an embodiment of the invention.

Another exemplary embodiment of a tuning controller of the present invention is described with respect to FIG. 23. This embodiment is oriented toward a power amplifier that is configurable to operate in two different frequency bands. One goal of the adaptive tuning for this embodiment is to keep voltages across transistor elements within the tunable output network, 2304, from exceeding a safe level as determined by transistor breakdown voltage constraints. Its mismatch detector, 2312, includes a real mismatch detector, 2310, an imaginary mismatch detector, 2311, and a voltage mismatch detector, 2314, which senses when voltage levels across transistors within the tunable output network, 2304, approach their maximum safe limit. The tuning controller, 2307, uses the output, 2313, of the voltage mismatch detector to change the transformation ratio of the tunable output network when an overvoltage condition is detected so as to restore voltage swings to safe levels.

Figure 24:
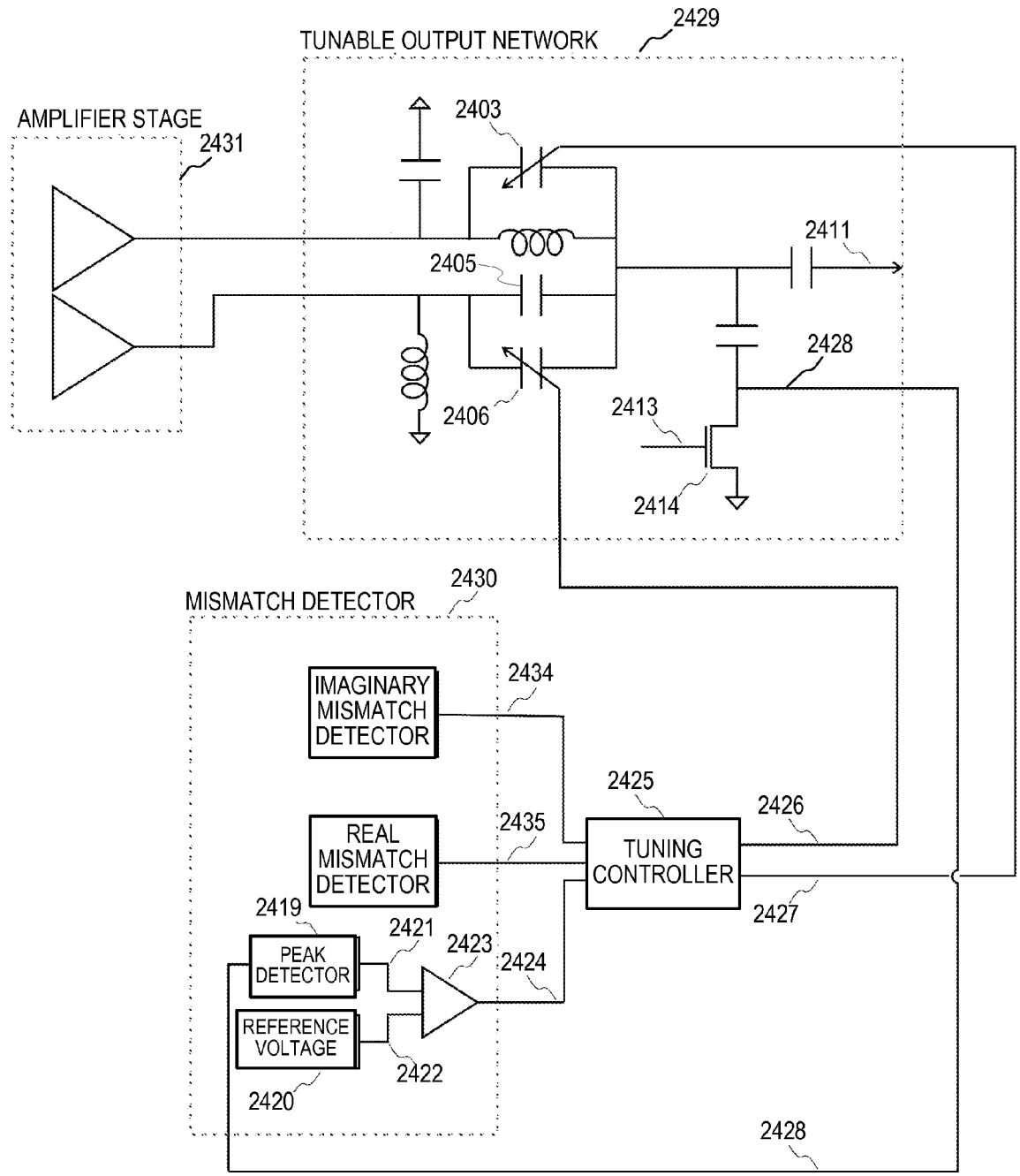
FIG. 24 illustrates additional details of the embodiment shown in FIG. 23.

A more detailed view of this embodiment is shown in FIG. 24. FIG. 25 illustrates an exemplary tuning algorithm for use with the embodiment shown in FIG. 24, where C5 is capacitor 2405, C3 is variable capacitor 2403, and C6 is variable capacitor 2406. The tunable output network, 2429, includes transistor 2414 that is used to reconfigure the amplifier's output network for operation in two different frequency bands. When the amplifier is operated in the higher of the two frequency bands, transistor 2414 is left open so that node 2428 is floating and the resonant frequency of the output network is raised. When the amplifier is operated in the lower of the two frequency bands, transistor 2414 is closed so that node 2428 is shorted to ground and the resonant frequency of the output network is lowered. Signal 2413, which selects between the two frequency bands, remains static for a given transmission. The output network also includes variable elements 2403 and 2406, which are used to make the network tunable.

RF voltages across transistor 2414 are small when it is closed. However, when transistor 2414 is open, RF voltages across it are nearly equal to those at the PA's output and can be very large. Without adaptive tuning, this voltage may exceed the allowable limit. Adaptive tuning can be used to detect and correct for this condition.

Mismatch detector, 2430, uses a peak detector, 2419, to sense the amplitude of RF signals on node 2428. The result, 2421, is compared in comparator 2423 to reference voltage, 2422, from reference voltage generator 2420, which is indicative of the desired voltage limit. The tuning controller, 2425, uses the mismatch detector's outputs, 2434, 2435, and 2424, to generate control signals, 2426 and 2427, that alter the capacitance of varactors 2403 and 2406.

If the PA's output stage, 2431, functions as a current source, then the voltage at node 2411 is directly related to the transformed impedance, $Z_T$, the transformation ratio, $$kr = \frac{R_L}{Z_T},$$

and the RF current, i, generated by the PA's output stage, 2431:

$$V_{11} \simeq \frac{R_L \cdot i}{\sqrt{k_R}}. \tag{11}$$

A decrease in the voltage at node 2411, translates directly into a decrease in the voltage on node 2428 when switch 2414 is off. Therefore, the task of limiting voltage swing at node 2428 is equivalent to that of limiting voltage swing at node 2411 and both can be accomplished by increasing the transformation ratio $k_R$, thereby decreasing the transformed impedance $Z_T$.

In the current embodiment it is desired that the tuning controller reacts very quickly to the danger condition flagged by signal 2424. This is accomplished by using signal 2424 as an interrupt request, which breaks into the main processing flow and executes an interrupt service routine. The interrupt service routine immediately reduces $Z_T$ by increasing $C_6$, 2406, and reducing $C_3$, 2403, by the same amount.

The tuning algorithm of FIG. 22 can be augmented to include this interrupt service routine. When an interrupt occurs, the controller increases D given by equation (10). Upon returning control to the main process, the ISR also returns the new value of D to be used by the main process as a minimum value, D_min, beyond which no real mismatch adjustment is allowed. Any S change requires a correction of the value of D_min.

Figure 26:
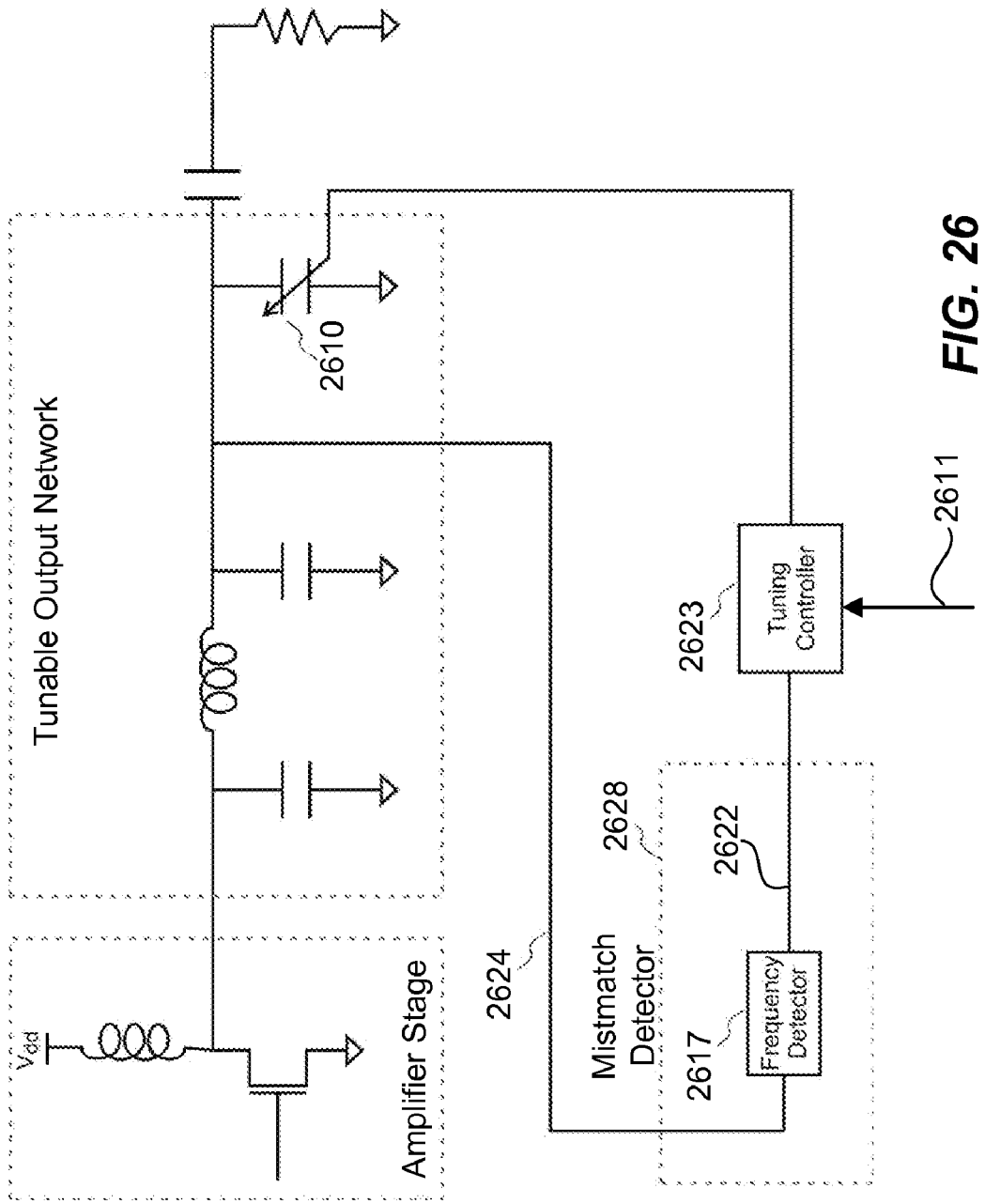
FIG. 26 illustrates an embodiment in which a power amplifier is configurable to operate in multiple frequency bands.

Referring to FIG. 26 another embodiment is illustrated in which a power amplifier is configurable to operate in multiple frequency bands. In the illustrated embodiment of FIG. 26, the frequency of an RF signal within the output network, such as signal 2624, is sent to the mismatch detector, 2628. A frequency detector 2617 determines the frequency of this signal and generates signal 2622, representative of this quantity. The tuning controller, 2623, operates to adjust variable tuning element 2610, within the tunable output network, in response to the measured frequency so as to optimize the output network's response to the detected frequency. In another embodiment, an indication of the desired frequency band, e.g., determined from a configuration setting, is sent to the tuning controller on 2611 instead of using the frequency detector 2617.

The description of the invention set forth herein is illustrative, and is not intended to limit the scope of the invention as set forth in the following claims. For example, although the RF power amplifier described herein is particularly well suited to power amplifiers built in CMOS, it could also be applied to power amplifiers built in other technologies such as GaAs, SiGe, SOI, and LDMOS. It can be applied to power amplifiers for any type of modulation, either linear or nonlinear, and for any intended power level. It is particularly well suited to power amplifiers within systems that include an antenna, but can also be applied with benefit to systems that do not include an antenna. Variations and modifications of the embodiments disclosed herein may be made based on the description set forth herein without departing from the scope of the invention as set forth in the following claims.

What is claimed is:

1. An adaptively tuned RF power amplifier comprising:
   at least one power amplifier stage having an active element;
   a tunable output network coupled to the at least one power amplifier stage, the tunable output network including one or more adjustable reactive elements;
   a mismatch detector to detect at least one tuning mismatch based, at least in part, on one or more signals, the one or more signals being present within at least one of the tunable output network and the at least one power amplifier stage, the mismatch detector configured to supply a mismatch indication of the tuning mismatch;
   a tuning controller responsive to the mismatch indication, to adjust at least one of the one or more adjustable reactive elements in the tunable output network so as to control the tuning mismatch; and
   wherein the tuning controller is operable to regulate a resonant frequency of the tunable output network and a transformation ratio of the tunable output network by adjusting the one or more adjustable reactive elements.

2. The adaptively tuned RF power amplifier as recited in claim 1 wherein the mismatch detector includes a voltage mismatch detector to detect when a voltage level within the tunable output network is at a threshold value.

3. The adaptively tuned RF power amplifier as recited in claim 1 wherein at least one of the one or more signals present within the tunable output network is an input signal to the tunable output network supplied by the power amplifier stage.

4. The adaptively tuned RF power amplifier as recited in claim 1 wherein at least one of the one or more signals present within the tunable output network is an output signal of the tunable output network.

5. The adaptively tuned RF power amplifier as recited in claim 1 wherein the tuning controller is responsive to a gain mismatch to adjust at least one of the one or more adjustable reactive elements in the tunable output network so as to change a transformation ratio of the tunable output network to control a gain of the power amplifier.

6. The adaptively tuned RF power amplifier as recited in claim 1, wherein the tuning controller is responsive to a resonant frequency mismatch, to adjust at least one of the one or more adjustable reactive elements in the tunable output network.

7. The adaptively tuned RF power amplifier as recited in claim 1 wherein the mismatch detector includes at least one of a gain mismatch detector, a phase mismatch detector, and an impedance mismatch detector.

8. The adaptively tuned RF power amplifier as recited in claim 1 wherein the signals present within the tunable output network include at least one of a voltage within the tunable output network and a current within the tunable output network.

9. An adaptively tuned RF power amplifier comprising:
   at least one power amplifier stage having an active element;
   a tunable output network coupled to the at least one power amplifier stage, the tunable output network including one or more adjustable reactive elements;
   a mismatch detector to detect at least one tuning mismatch based, at least in part, on one or more signals, the one or more signals being present within at least one of the tunable output network and the at least one power amplifier stage, the mismatch detector configured to supply a mismatch indication of the tuning mismatch; and
   a tuning controller responsive to the mismatch indication, to adjust at least one of the one or more adjustable reactive elements in the tunable output network so as to control the tuning mismatch;
   wherein the mismatch detector includes at least one of a real mismatch detector and an imaginary mismatch detector.

10. An adaptively tuned RF power amplifier comprising:
    at least one power amplifier stage having an active element;
    a tunable output network coupled to the at least one power amplifier stage, the tunable output network including one or more adjustable reactive elements;
    a mismatch detector to detect at least one tuning mismatch based, at least in part, on one or more signals, the one or more signals being present within at least one of the tunable output network and the at least one power amplifier stage, the mismatch detector configured to supply a mismatch indication of the tuning mismatch;
    a tuning controller responsive to the mismatch indication, to adjust at least one of the one or more adjustable reactive elements in the tunable output network so as to control the tuning mismatch; and
    wherein the tuning controller is operable to independently control a resonant frequency of the tunable output network and a transformed load impedance seen by the at least one power amplifier stage.

11. The adaptively tuned RF power amplifier as recited in claim 10 wherein the tunable output network further comprises:
    a first adjustable capacitance coupled in parallel at a first and a second node with an inductor;
    a capacitance switch circuit coupled to the first and second nodes and operable to selectively couple a second variable capacitance between the first node and ground and a third variable capacitance between the second node and ground; and
    wherein adjustments to the first variable capacitance controls the resonant frequency of the tunable output network independently of the transformed load impedance and adjustments of the capacitance switch circuit controls the transformed load impedance independently of the resonant frequency.

12. An adaptively tuned RF power amplifier comprising:
    at least one power amplifier stage having an active element;
    a tunable output network coupled to the at least one power amplifier stage, the tunable output network including one or more adjustable reactive elements;
    a mismatch detector to detect at least one tuning mismatch based, at least in part, on one or more signals, the one or more signals being present within at least one of the tunable output network and the at least one power amplifier stage, the mismatch detector configured to supply a mismatch indication of the tuning mismatch;
    a tuning controller responsive to the mismatch indication, to adjust at least one of the one or more adjustable reactive elements in the tunable output network so as to control the tuning mismatch; and
    wherein the adaptively tuned RF power amplifier is responsive to an indication of operation in a first frequency band to configure the tunable output network to have a first resonant frequency and responsive to an indication of operation in a second frequency band lower than the first frequency band to configure the tunable output network to have a second resonant frequency lower than the first resonant frequency.

13. An adaptively tuned RF power amplifier comprising:
    at least one power amplifier stage having an active element;
    a tunable output network coupled to the at least one power amplifier stage, the tunable output network including one or more adjustable reactive elements;
    a mismatch detector to detect at least one tuning mismatch based, at least in part, on one or more signals, the one or more signals being present within at least one of the tunable output network and the at least one power amplifier stage, the mismatch detector configured to supply a mismatch indication of the tuning mismatch;
    a tuning controller responsive to the mismatch indication, to adjust at least one of the one or more adjustable reactive elements in the tunable output network so as to control the tuning mismatch; and
    wherein the mismatch detector is operable to determine relative phase shifts across different elements of the tunable output network to indicate the tuning mismatch in the output network.

14. An adaptively tuned RF power amplifier comprising:
    at least one power amplifier stage having an active element;
    a tunable output network coupled to the at least one power amplifier stage, the tunable output network including one or more adjustable reactive elements;
    a mismatch detector to detect at least one tuning mismatch based, at least in part, on one or more signals, the one or more signals being present within at least one of the tunable output network and the at least one power amplifier stage, the mismatch detector configured to supply a mismatch indication of the tuning mismatch;
    a tuning controller responsive to the mismatch indication, to adjust at least one of the one or more adjustable reactive elements in the tunable output network so as to control the tuning mismatch; and
    wherein the tuning controller is operable to control a transformed load impedance seen by the at least one power amplifier stage.

15. A method of controlling a tuning mismatch in an adaptively tuned RF power amplifier including at least one power amplifier stage coupled to a tunable output network, the method comprising:
    detecting at least one tuning mismatch based, at least in part, on a signal present within at least one of the tunable output network and the at least one power amplifier stage;
    generating one or more tuning control signals in response to detecting the at least one tuning mismatch;

adjusting one or more adjustable reactive elements in the tunable output network so as to control the at least one tuning mismatch in response to the one or more tuning control signals; and controlling a resonant frequency of the tunable output network and a transformed load impedance seen by the at least one power amplifier stage.

16. The method as recited in claim 15 wherein detecting the at least one tuning mismatch further comprises detecting at least one of a real mismatch in a real mismatch detector and an imaginary mismatch in an imaginary mismatch detector.

17. The method as recited in claim 15 wherein the at least one tuning mismatch includes a first and second tuning mismatch, wherein the first tuning mismatch is a mismatch between a desired and actual resonant frequency of the tunable output network, and the second tuning mismatch is a mismatch between a desired and actual transformation ratio of the tunable output network, the tuning controller controlling the first and second tuning mismatches by adjusting two or more reactive elements within the tunable output network so as to achieve substantially independent regulation of the first and second tuning mismatch.

18. The method as recited in claim 15 further comprising compensating for a change in a gain of the adaptively tuned power amplifier by changing a transformation ratio in a direction opposite to a direction of change of the gain of the adaptively tuned power amplifier by adjusting at least one of the one or more adjustable reactive elements in the output network.

19. The method as recited in claim 15 wherein the at least one tuning mismatch being detected is at least one of an imaginary impedance mismatch and a resonant frequency mismatch.

20. A method of controlling a tuning mismatch in an adaptively tuned RF power amplifier including at least one power amplifier stage coupled to a tunable output network, the method comprising:
    detecting at least one tuning mismatch based, at least in part, on a signal present within at least one of the tunable output network and the at least one power amplifier stage;
    generating one or more tuning control signals in response to detecting the at least one tuning mismatch;
    adjusting one or more adjustable reactive elements in the tunable output network so as to control the at least one tuning mismatch in response to the one or more tuning control signals; wherein the at least one tuning mismatch is detected according to a voltage level within the tunable output network and a threshold voltage value; and
    wherein the at least one tuning mismatch is detected according to a voltage level within the tunable output network and a threshold voltage value.

21. A method of controlling a tuning mismatch in an adaptively tuned RF power amplifier including at least one power amplifier stage coupled to a tunable output network, the method comprising:
    detecting at least one tuning mismatch based, at least in part, on a signal present within at least one of the tunable output network and the at least one power amplifier stage;
    generating one or more tuning control signals in response to detecting the at least one tuning mismatch;
    adjusting one or more adjustable reactive elements in the tunable output network so as to control the at least one tuning mismatch in response to the one or more tuning control signals; wherein the at least one tuning mismatch is detected according to a voltage level within the tunable output network and a threshold voltage value; and
    configuring the tunable output network to have a first resonant frequency in response to an indication of operation of the adaptively tuned RF power amplifier in a first frequency band and configuring the tunable output network to have a second resonant frequency lower than the first resonant frequency in response to an indication of operation of the adaptively tuned RF power amplifier in a second frequency band lower than the first frequency band.

22. A method of controlling a tuning mismatch in an adaptively tuned RF power amplifier including at least one power amplifier stage coupled to a tunable output network, the method comprising:
    detecting at least one tuning mismatch based, at least in part, on a signal present within at least one of the tunable output network and the at least one power amplifier stage;
    generating one or more tuning control signals in response to detecting the at least one tuning mismatch;
    adjusting one or more adjustable reactive elements in the tunable output network so as to control the at least one tuning mismatch in response to the one or more tuning control signals; wherein the at least one tuning mismatch is detected according to a voltage level within the tunable output network and a threshold voltage value; and
    detecting the tuning mismatch using relative phase shifts across different elements of the tunable output network to indicate the tuning mismatch.

23. A method of controlling a tuning mismatch in an adaptively tuned RF power amplifier including at least one power amplifier stage coupled to a tunable output network, the method comprising:
    detecting at least one tuning mismatch based, at least in part, on a signal present within at least one of the tunable output network and the at least one power amplifier stage;
    generating one or more tuning control signals in response to detecting the at least one tuning mismatch;
    adjusting one or more adjustable reactive elements in the tunable output network so as to control the at least one tuning mismatch in response to the one or more tuning control signals; wherein the at least one tuning mismatch is detected according to a voltage level within the tunable output network and a threshold voltage value; and
    wherein detecting the at least one tuning mismatch comprises determining which of a first input signal to an output network or a second input signal to an output network is closer in phase to an output of the output network and providing an indication thereof as an indication of the tuning mismatch.

24. An adaptively tuned RF power amplifier comprising:
    at least one power amplifier stage having an active element;
    a tunable output network coupled to the at least one power amplifier stage, the tunable output network including one or more adjustable reactive elements;
    means for detecting at least one tuning mismatch based, at least in part, on one or more signals, the one or more signals being present within at least one of the tunable output network and the at least one power amplifier stage, and for supplying a mismatch indication of the tuning mismatch;
    means, responsive to the mismatch indication, for adjusting at least one of the one or more adjustable reactive elements in the tunable output network so as to control the tuning mismatch; and wherein the means for adjusting further comprises means for independently controlling a resonant frequency of the tunable output network and a transformed load impedance seen by the at least one power amplifier stage.

25. The adaptively tuned RF power amplifier as recited in claim 24 further comprising means for detecting at least one of a real mismatch and an imaginary mismatch.

* * * * *